(12) United States Patent
Lerman et al.

(10) Patent No.: US 8,338,199 B2
(45) Date of Patent: Dec. 25, 2012

(54) SOLID STATE LIGHT SHEET FOR GENERAL ILLUMINATION

(75) Inventors: Louis Lerman, Las Vegas, NV (US); Allan Brent York, Langley (CA); Michael David Henry, Albuquerque, NM (US); Robert Steele, Redwood City, CA (US); Brian D. Ogonowsky, Mountain View, CA (US)

(73) Assignee: Quarkstar LLC, Las Vegas, NV (US)

( * ) Notice: Subject to any disclaimer, the term of this patent is extended or adjusted under 35 U.S.C. 154(b) by 0 days.

(21) Appl. No.: 12/870,760

(22) Filed: Aug. 27, 2010

(65) Prior Publication Data

US 2011/0195532 A1 Aug. 11, 2011

(51) Int. Cl.
*H01L 21/00* (2006.01)
(52) U.S. Cl. ............. 438/27; 257/59; 257/E33.061
(58) Field of Classification Search ............. 438/27
See application file for complete search history.

(56) References Cited

U.S. PATENT DOCUMENTS

| | | | |
|---|---|---|---|
| 4,445,132 A * | 4/1984 | Ichikawa et al. ............. 257/72 |
| 5,884,994 A | 3/1999 | Herst et al. |
| 5,925,897 A | 7/1999 | Oberman |
| 6,087,680 A | 7/2000 | Gramann et al. |
| 6,113,433 A | 9/2000 | Al-Turki |
| 6,270,236 B1 | 8/2001 | Brussog |
| 6,541,908 B1 | 4/2003 | Cheung et al. |
| 6,557,393 B1 | 5/2003 | Gokhfeld et al. |
| 6,693,551 B2 | 2/2004 | Pederson |
| 6,786,621 B2 | 9/2004 | Sviland |
| 6,876,143 B2 | 4/2005 | Daniels |
| 6,936,855 B1 | 8/2005 | Harrah |
| 7,052,924 B2 | 5/2006 | Daniels et al. |
| 7,217,956 B2 | 5/2007 | Daniels et al. |
| 7,259,030 B2 | 8/2007 | Daniels et al. |

(Continued)

FOREIGN PATENT DOCUMENTS

EP 2159780 3/2010

(Continued)

OTHER PUBLICATIONS

"Why pay for the lamp when you just need the light?," Lightsheet, Articulux, Articulated Technologies web page downloaded on Aug. 27, 2010 from http://www.buylightsheet.com/, 1 page.

(Continued)

*Primary Examiner* — Tony Tran
(74) *Attorney, Agent, or Firm* — Fish & Richardson P.C.

(57) ABSTRACT

A solid state light sheet and method of fabricating the sheet are disclosed. In one embodiment, bare blue-light LED chips have top and bottom electrodes, where the bottom electrode is a large reflective electrode. The bottom electrodes of an array of LEDs (e.g., 500 LEDs) are bonded to an array of electrodes formed on a flexible bottom substrate. Conductive traces are formed on the bottom substrate connected to the electrodes. In one embodiment, an intermediate sheet having holes is then affixed to the bottom substrate, with the LEDs passing through the holes. A transparent top substrate having conductors is then laminated over the intermediate sheet. In another embodiment, no intermediate sheet is used. Various ways to connect the LEDs in series are described along with many embodiments. The light sheet provides a practical substitute for a standard 2×4 foot fluorescent ceiling fixture. A phosphor is used to generate white light.

12 Claims, 10 Drawing Sheets

U.S. PATENT DOCUMENTS

| | | | |
|---|---|---|---|
| 7,378,124 B2 | 5/2008 | Daniels | |
| 7,427,782 B2 | 9/2008 | Daniels et al. | |
| 7,476,557 B2 | 1/2009 | Daniels et al. | |
| 7,609,006 B2 | 10/2009 | Gibboney | |
| 7,745,838 B2 | 6/2010 | Lefevre | |
| 7,777,166 B2 | 8/2010 | Roberts | |
| 7,858,994 B2 | 12/2010 | Daniels | |
| 2002/0149933 A1 | 10/2002 | Archer et al. | |
| 2003/0160256 A1 | 8/2003 | Durocher et al. | |
| 2004/0189218 A1 | 9/2004 | Leong et al. | |
| 2005/0174769 A1 | 8/2005 | Yong et al. | |
| 2005/0207152 A1 | 9/2005 | Maxik | |
| 2005/0207156 A1 | 9/2005 | Wang et al. | |
| 2005/0265024 A1 | 12/2005 | Luk | |
| 2006/0221606 A1 | 10/2006 | Dowling | |
| 2007/0090387 A1 | 4/2007 | Daniels et al. | |
| 2007/0103066 A1 | 5/2007 | D'Andrade et al. | |
| 2007/0126354 A1 | 6/2007 | Chao | |
| 2007/0228999 A1 | 10/2007 | Kit | |
| 2007/0241355 A1 | 10/2007 | Chua | |
| 2007/0280593 A1* | 12/2007 | Brychell et al. | 385/31 |
| 2007/0290217 A1 | 12/2007 | Daniels | |
| 2008/0079012 A1 | 4/2008 | Grote et al. | |
| 2008/0080163 A1 | 4/2008 | Grote, III et al. | |
| 2008/0080200 A1 | 4/2008 | Robbins et al. | |
| 2008/0089069 A1* | 4/2008 | Medendorp | 362/294 |
| 2008/0117500 A1 | 5/2008 | Narendran et al. | |
| 2008/0179602 A1 | 7/2008 | Negley et al. | |
| 2008/0238338 A1 | 10/2008 | Latham et al. | |
| 2008/0238649 A1 | 10/2008 | Arszman et al. | |
| 2009/0045418 A1 | 2/2009 | Yeh | |
| 2009/0046457 A1 | 2/2009 | Everhart | |
| 2009/0114928 A1 | 5/2009 | Messere et al. | |
| 2009/0195787 A1 | 8/2009 | Granados et al. | |
| 2009/0237916 A1* | 9/2009 | Park | 362/97.1 |
| 2009/0261357 A1 | 10/2009 | Daniels | |
| 2009/0261743 A1 | 10/2009 | Chen et al. | |
| 2010/0044589 A1 | 2/2010 | Garcia et al. | |
| 2010/0084665 A1* | 4/2010 | Daniels et al. | 257/88 |
| 2010/0102729 A1 | 4/2010 | Katzir et al. | |
| 2010/0164344 A1 | 7/2010 | Boerner et al. | |
| 2010/0308353 A1 | 12/2010 | Grabowski et al. | |
| 2010/0317132 A1 | 12/2010 | Rogers et al. | |
| 2011/0050073 A1 | 3/2011 | Huang | |
| 2011/0069487 A1 | 3/2011 | Ng et al. | |
| 2011/0133658 A1 | 6/2011 | Sauerlaender et al. | |
| 2011/0170288 A1 | 7/2011 | Kim | |
| 2011/0260741 A1 | 10/2011 | Weaver et al. | |
| 2011/0267560 A1* | 11/2011 | Usukura | 349/62 |
| 2011/0298371 A1 | 12/2011 | Brandes et al. | |

FOREIGN PATENT DOCUMENTS

| | | |
|---|---|---|
| JP | 61-198690 | 9/1986 |
| JP | 08-018105 | 1/1996 |
| WO | WO 2005/099310 | 10/2005 |

OTHER PUBLICATIONS

"A Breakthrought in LED Technology," Lightsheet™ versus the other LED Manufacturing Technology, Lightsheet, Articulux, Articulated Technologiesweb page downloaded on Aug. 27, 2010 from http://www.buylightsheet.com/how,html, 1 page.

"Competitive Advantage of Lightsheet™ Technology," Articulated Technologies white paper, 4 pages.

S. W. Rickly Lee et al., "Process Development and Prototyping for the Assembly of LED Arrays on Flexible Printed Circuit Tape for General Solid State Lighting," 2009 IEEE, 2009 Electronic Components and Technology Conference, pp. 2137-2142.

James Gourlay et al., "79.4: Light-Rolls: High Throughput Manufacture for LED Lighting and Displays," SID 2010 Digest, pp. 1184-1187.

Konstantinos A. Sierros et al., "59.2: Durable Solid State Flexible LED Devices," SID 2010 Digest, pp. 882-885.

James Gourlay et al., "74.2: High Efficiency Hybrid LED Backlight for Large-area LCD TV," 2010 SID Digest, pp. 1097-1099.

English translation of Japanese Patent No. JP61-19869, 11 pages.

English translation of Japanese Patent No. JP08-018105, 12 pages.

LED Bulb with 5W Power Consumption. product description, downloaded on Nov. 22, 2010 from http://www.best-b2b.com/Products/867/890-2/led-bulb-with-5w-power-consumption_417 . . . pp. 1-2.

Vergoosen, Invitation to Pay Additional Fees in PCT/US2011/049233 dated Dec. 22, 2011, 7 pages.

* cited by examiner

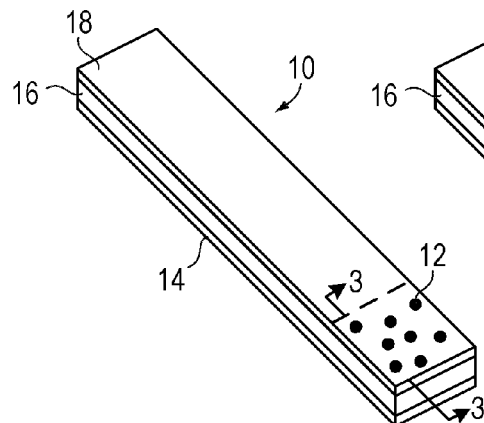
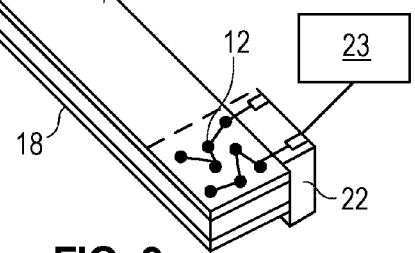
FIG. 1     FIG. 2
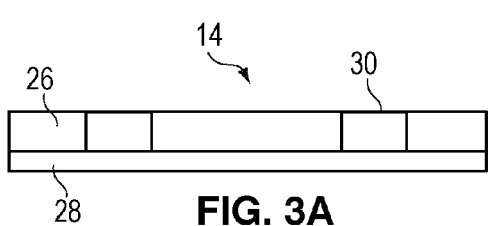
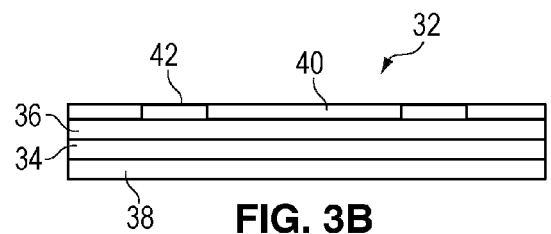
FIG. 3A     FIG. 3B
FIG. 3C
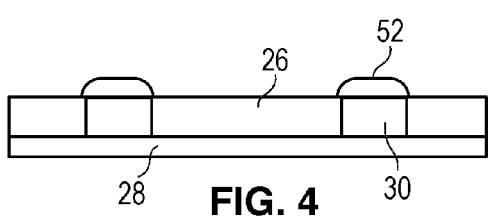
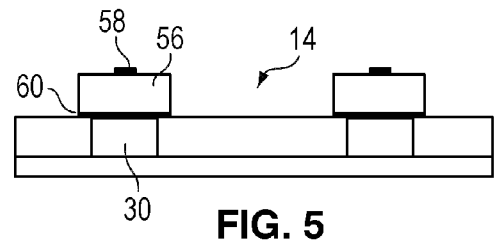
FIG. 4     FIG. 5
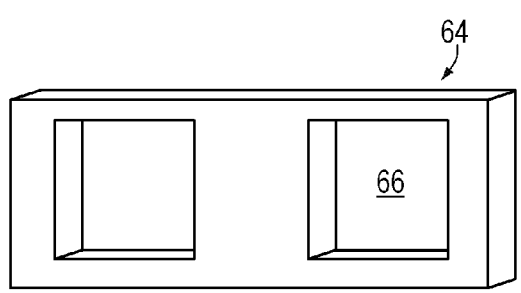
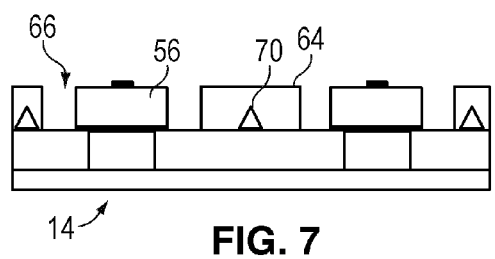
FIG. 6     FIG. 7

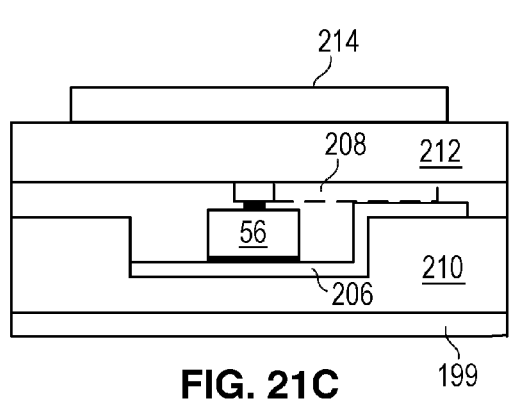
FIG. 21C
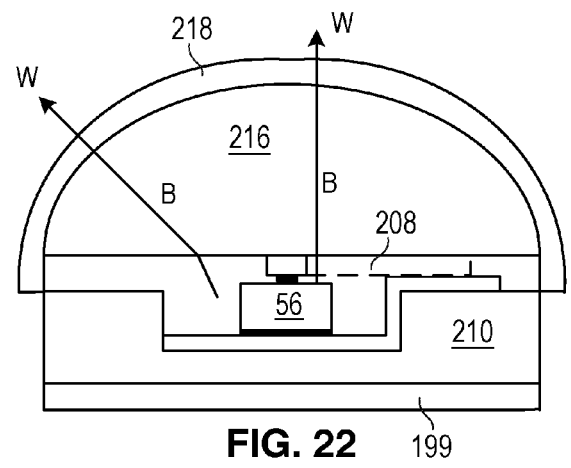
FIG. 22
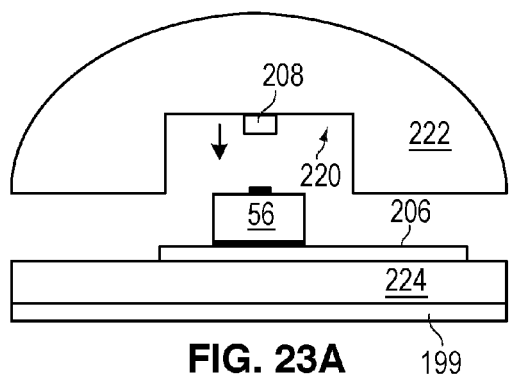
FIG. 23A
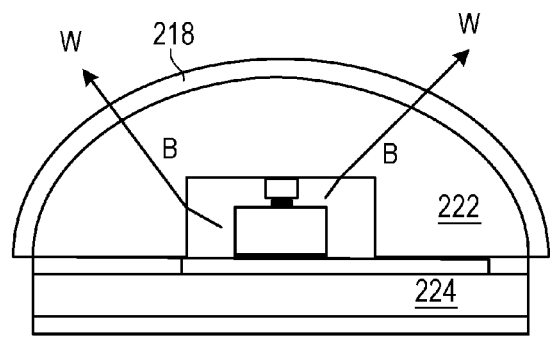
FIG. 23B
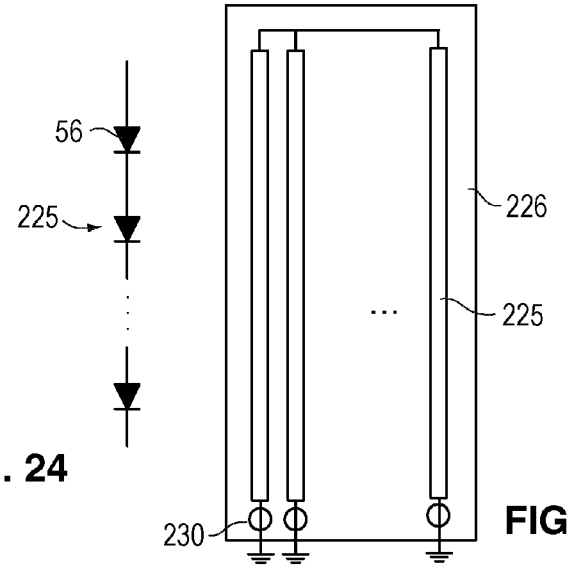
FIG. 24
FIG. 25

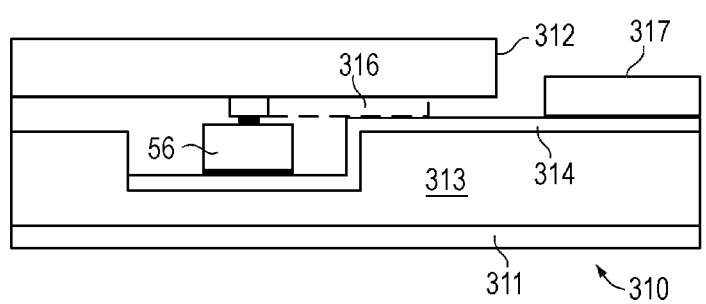
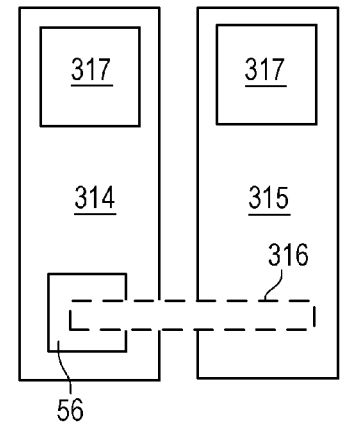
FIG. 30A
FIG. 30B
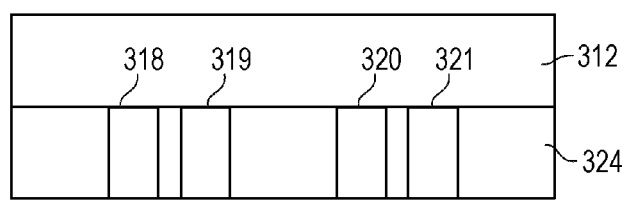
FIG. 31
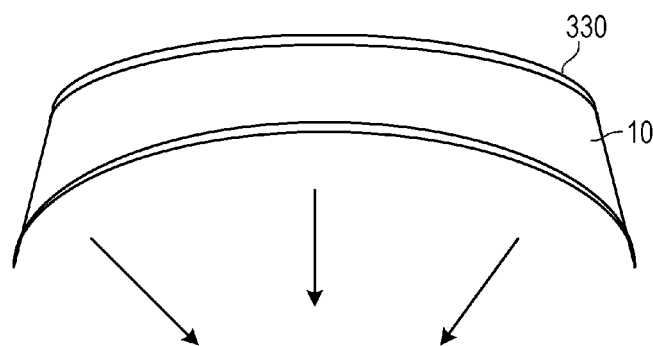
FIG. 32

SOLID STATE LIGHT SHEET FOR GENERAL ILLUMINATION

FIELD OF INVENTION

This invention relates to solid state illumination and, in particular, to a light sheet containing light emitting diodes (LEDs) that may be used as a substitute for standard fluorescent lamp fixtures.

BACKGROUND

High power LEDs are the conventional choice for general solid state lighting applications. Such high power white LEDs are extremely bright and can have luminous efficacies between 100 and 200 lumens/watt. The input power of a single high-power LED is typically greater than 0.5 watt and may be greater than 10 watts. Such LEDs generate considerable heat since they are only about 1 mm$^2$ in area, so the required packaging is fairly complex and expensive. Although a bare high-power LED chip typically costs well under $1.00 (e.g., $0.10), the packaged LED typically costs around $1.50-$3.00. This makes a high output (e.g., 3000+ lumens) solid state luminaire relatively expensive and not a commercially feasible alternative for a standard 2×4 foot fluorescent light fixture, commonly used in offices. Further, the optics required to convert the high brightness point sources into a substantially homogeneous, broad angle emission for an office environment (where glare control is important) is extremely challenging.

To greatly reduce the cost of a large area, high lumen output light source, it is known to sandwich an array of bare LED dice between a bottom sheet having conductors and a top transparent sheet having conductors. The LEDs have top and bottom electrodes that contact a set of conductors. When the conductors are energized, the LEDs emit light. The light sheet may be flexible.

The Japanese published application S61-198690 by Hiroshi (filed in 1985 and published on 3 Sep. 1986) describes a light sheet using a plastic transparent front substrate having thin wires formed on it. A bottom substrate also has thin wires formed on it. An array of bare LED chips with top and bottom electrodes is arranged on the bottom substrate, and the front substrate is adhesively secured over the LED chips. LED chips at the intersections of energized perpendicular wires emit light.

The Japanese published application H08-18105 by Hirohisa (filed in 1994 and published on 19 Jan. 1996) describes a light sheet using a transparent front substrate having transparent electrodes (ITO) connected to metal strips. A backside substrate has metal conductors arranged in strips. Bottom electrodes of bare LED chips are bonded to the metal conductors on the backside substrate, such as using solder paste and reflow. A stamped "epoxy hotmelt adhesive" is provided on the backside substrate surrounding the LED chips. A liquid epoxy molding resin then fills in the inner area within the epoxy hotmelt adhesive. The hotmelt adhesive is then softened, and the front substrate is then affixed over the LED chips using the hotmelt adhesive and the cured molding resin. Applying current to the perpendicular strips of metal conductors on the opposing substrates energizes an LED chip at the intersection of two conductors. In one embodiment, the front and backside conductors/electrodes are formed over the entire surface, so all the LED chips will be energized simultaneously for use as an illuminator.

U.S. Pat. No. 6,087,680 to Gramann (priority filing date 31 Jan. 1997, issued 11 Jul. 2000) describes a light sheet using "elastic plastic" top and bottom substrates. Thin metal conductor strips and electrodes are sputtered onto the substrates or deposited in other conventional ways. Bare LED chips are provided with top and bottom electrodes. A conductive adhesive is used to adhere the bottom electrodes of the LED chips to the bottom substrate electrodes. A "coupling medium" fills in the spaces between the LED chips and is used for increasing light extraction. The coupling medium may be a liquid adhesive such as epoxy, resin, or silicone. The top substrate is then affixed over the LED chips, where the adhesive coupling medium affixes the substrates together and encapsulates the LED chips. Gramann describes the top and bottom substrates being "a structured conducting foil being formed essentially of plastic" that is capable of "plastic or elastic deformation," so the light sheet is flexible.

Various patents to Daniels et al. have been issued relating to the earlier light sheets described above. These include U.S. Pat. Nos. 7,217,956; 7,052,924; 7,259,030; 7,427,782; and 7,476,557. Daniels' basic process for forming a flexible light sheet is as follows. Bare LED chips having top and bottom electrodes are provided. A bottom substrate sheet is provided with metal conductor strips and electrodes. A hotmelt adhesive sheet is formed separately, and the LED chips are embedded into the adhesive sheet. A transparent top substrate sheet is provided with metal conductor strips leading to transparent ITO electrodes. The adhesive sheet, containing the LEDs, is sandwiched between the top and bottom substrates, and the three layers are laminated together using heat and pressure so that there is electrical contact between the LED chips' electrodes and the opposing substrate electrodes. The process is performed as a continuous roll-to-roll process. The roll is later cut for a particular application. The LED chips may be arranged in a pattern to create a sign, or the LED chips may be arranged in an array to provide illumination.

In an alternative Daniels process, described in U.S. Pat. No. 7,259,030, a bottom substrate has an adhesive conductive sheet over it, on which is laminated a double sided adhesive sheet with holes. The LEDs are then placed in the holes, and another conductive sheet is laminated over the double sided adhesive sheet. The top transparent substrate is then laminated over the conductive sheet. The LEDs are electrically bonded to the two conductive layers by a high pressure roller at the end of the lamination process so the LEDs are connected in parallel.

Problems with the above-described prior art include: 1) little or no consideration for removing heat from the LEDs; 2) excessive downward pressure on the LEDs during lamination; 3) total internal reflections (TIR) caused by differences in indices of refraction; 4) difficulty in providing phosphor over/around the LEDs to create white light; 5) no consideration for enabling the light sheet to be optically functional and aesthetically pleasing if one or more LEDs fail (e.g., shorts out); 6) unattractive non-uniformity of light and color over the light sheet area; 7) difficulty of manufacture; 8) unreliability of LED electrode bonding; 9) excessively high lamination pressures needed to create wide light sheets; 10) inefficiency due to light absorption; 11) difficulty in creating series strings of LEDs; and 12) impractical electrical drive requirements for the LEDs. There are other drawbacks with the above-described light sheets.

What is needed is a cost-effective light sheet that can substitute for a standard fluorescent lamp fixture or that can be used for other lighting applications.

SUMMARY

Light sheets and techniques for fabricating the light sheets are described that overcome drawbacks with the prior art.

In one embodiment, a flexible circuit is formed as a strip, such as 3-4 inches by 4 feet, or in a single large sheet, such as a 2×4 foot sheet. On the bottom of the sheet is formed a conductor pattern using plated copper traces leading to connectors for one or more power supplies. At certain areas of the flex circuit, where bare LED chips are to be mounted, metal vias extend through the flex circuit to form an electrode pattern on the top surface of the flex circuit. In one embodiment, the pattern is a pseudo-random pattern, so if any LED fails (typically shorts) or any electrode bond fails, the dark LED will not be noticeable. In another embodiment, the pattern is an ordered pattern. If the light sheet spreads the LED light laterally, a dark LED may not be noticeable due to the light mixing in the light sheet. The metal vias provide heat sinks for the LEDs, since the rising heat from the LEDs will be removed by the air above the light sheet when the light sheet is mounted in a ceiling. The metal vias can be any size or thickness, depending on the heat needed to be extracted.

In another embodiment, the sheet comprises a highly reflective layer, such as an aluminum layer, having a dielectric coating on both surfaces. The reflective sheet is patterned to have conductors and electrodes formed on it. The aluminum layer also serves to spread the LED heat laterally. The dielectric coatings may have a relatively high thermal conductivity, and since the sheet is very thin (e.g., 1-4 mils, or less than 100 microns), there is good vertical thermal conduction. Such reflective films will reflect the LED light towards the light output surface of the light sheet.

Bare LED chips (also referred to as dice) are provided, having top and bottom electrodes. The bottom electrodes are bonded to the metal vias extending through the top of the flex circuit. A conductive adhesive may be used, or the LEDs may be bonded by ultrasonic bonding, solder reflow, or other bonding technique. In one embodiment, low power (e.g., 60-70 milliwatts) blue or ultraviolet LEDs are used. Using low power LEDs is advantageous because: 1) hundreds of LEDs may be used in the light sheet to spread the light; 2) low power LEDs are far less expensive than high power LEDs; 3) there will be little heat generated by each LED; 4) a failure of a few LEDs will not be noticeable; 5) the localized LED light and slightly varying colors will blend into a substantially homogenous light source a few feet from the light sheet without complex optics; 6) the blue light can be converted to white light using conventional phosphors; 7) higher voltages can be used to power many series-connected LEDs in long strips to reduce power loss through the conductors; and other reasons.

Over the top of the flex circuit is affixed a thin transparent sheet (an intermediate sheet), such as a PMMA sheet or other suitable material, that has holes formed around each LED. The intermediate sheet is formed with reflectors such as prisms on its bottom surface or with reflectors within the sheet, such as birefringent structures, to reflect light upward. The thickness of the intermediate sheet limits any downward pressure on the LEDs during the lamination process. The top electrodes of the LEDs may protrude slightly through the holes in the intermediate sheet or may be substantially flush. The intermediate sheet may be secured to the flex circuit with a thin layer of silicone or other adhesive or bonding technique.

The intermediate sheet may also be provided with a thin reflective layer, such as aluminum, on its bottom surface for reflecting light. Since the flex circuit conductors are on the bottom of the flex circuit, and the metal vias are only in the holes of the intermediate sheet, there is no shorting of the conductors by the metal reflective surface of the intermediate sheet.

In one embodiment, the LEDs have a thickness between about 85-250 microns, and the intermediate sheet surrounding the LEDs is about the same thickness as the LEDs.

In another embodiment, the intermediate sheet is a dielectric sheet having cups molded into it at the positions of the LEDs. The cups have a hole in the bottom for the LEDs to pass through. The surface of the sheet is coated with a reflective layer, such as aluminum, which is coated with a clear dielectric layer. The reflective cups are formed to create any light emission pattern from a single LED. In such an embodiment, the LED light will not mix within the intermediate sheet but will be directly reflected out.

The space between the LEDs and the hole (or cup) walls in the intermediate sheet are then filled with a mixture of silicone and phosphor to create white light. The silicone encapsulates the LEDs and removes any air gaps. The silicone is a high index of refraction silicone so that there will be good optical coupling from the GaN LED (a high index material), to the silicone/phosphor, and to the intermediate sheet. The area around each LED in the light sheet will be the same, even though the alignment is not perfect. The LEDs may be on the order of $0.25$ mm$^2$-$1$ mm$^2$, and the intermediate sheet holes may have diameters around 3 mm or more, depending on the required amount of phosphor needed. Even if an LED is not centered with respect to the hole, the increased blue light from one side will be offset by the increased red-green light components (or yellow light component) from the other side. The light from each LED and from nearby LEDs will mix in the intermediate sheet and further mix after exiting the light sheet to form substantially homogenous white light.

In one embodiment, the LEDs have a top surface area on the order of 100×100 microns to 300-300 microns, and a thickness of 85-250 microns. Therefore, there is a significant side emission component.

A transparent flex circuit is then laminated over the intermediate sheet, where the top flex circuit has a conductor and electrode pattern. The electrodes may have a conductive adhesive for bonding to the top electrodes of the LEDs. A silicone layer may be provided on the flex circuit or on the intermediate sheet for affixing the sheets together. The transparent flex circuit is then laminated under heat and pressure to create good electrical contact between the LED electrodes and the top circuitry. The intermediate sheet prevents the downward pressure during lamination from excessively pressing down on the LEDs. The intermediate sheet also ensures the light sheet will have a uniform thickness so as to avoid optical distortions.

To avoid a bright blue spot over each LED, when viewed up close, the top flex circuit electrode may be a relatively large diffusing reflector (e.g., silver) that reflects the blue light into the surrounding phosphor. Such a large reflector also reduces the alignment tolerance for the sheets.

Even if a reflector over each LED is not used, and since the LEDs are small and not very bright individually, the blue light from the top surface of the LEDs may be directly output and mixed with the red/green or yellow light generated by the phosphor surrounding the LED to create white light a short distance from the light sheet.

Alternatively, phosphor may be formed as a dot on the top surface of the top flex circuit above each LED. This would avoid a blue spot over each LED. The phosphor/silicone in the holes, encapsulating the LEDs, would then be used just for converting the side light from the LEDs. If light from the top surface of each LED is to exit the top flex circuit for conversion by the remote phosphor, the flex circuit electrode may be transparent, such as a layer of ITO. In an alternative embodiment, there is no phosphor deposited in the holes in the intermediate sheet, and all conversion is done by a remote phosphor layer on the top surface of the top flex circuit.

In one embodiment, the LED chips are flip chips, and all electrodes and conductors are formed on the bottom substrate. This simplifies the series connections of the LEDs and improves electrode bond reliability.

For easing the formation of series connections with LED chips having top and bottom electrodes, the LED chips may be alternately mounted upside down on the bottom substrate so that the cathode of an LED chip can be connected in series to the anode of an adjacent LED chip using the conductor pattern on the bottom substrate. The top substrate also has a conductor pattern for connecting the LEDs in series. Combinations of series and parallel groups can be created to optimize the power supply requirements.

In another embodiment, the intermediate sheet has electrodes formed on opposing walls of its square holes. The LED chips, with top and bottom electrodes, are then inserted vertically in the holes so that the LED electrodes contact the opposing electrodes formed on the walls of the holes. The electrodes formed in the holes extend to a top surface, a bottom surface, or both surfaces of the intermediate sheet for being interconnected by a conductor pattern on the top substrate or bottom substrate. In an alternate embodiment, the conductor pattern for any series connection or series/parallel connection is formed directly on a surface or both surfaces of the intermediate sheet.

In another embodiment, there is no intermediate sheet and conductors are patterned on top and bottom substrates. One or both of the substrates has a cavity or groove to accommodate the thickness of the LEDs. The vertical LEDs are then sandwiched between the two substrates. The conductor patterns on the opposing substrates are such that the sandwiching connects the conductors to couple adjacent LEDs in series. The substrates may be formed as flat strips or sheets, or rounded, or a combination of flat and rounded. In one embodiment, the sandwiched structure forms a flexible cylinder or half cylinder that contains a single string of series connected LEDs. The flexible strings may be connected in series with other strings or connected in parallel with other strings, depending on the desired power supply.

Other variations are described.

If the light sheet is formed in strips, each strip may use its own power supply and be modular. By fabricating the light sheet in strips, there is less lamination pressure needed, and the lamination pressure will be more uniform across the width of the strip. The strips can be arranged next to each other to create any size light sheet, such as a 2×4 foot light sheet to substitute for light sources within a standard fluorescent fixture in an office environment. It is common for fluorescent fixtures within a given ceiling cut-out to contain two, three, four or more linear fluorescent lamps. Each light sheet strip may substitute for a single fluorescent lamps and have a similar length. This embodiment of the light sheet can generate the 3000 lumens needed to replace the typical fluorescent lamp and, by inserting the required number of strips, it is possible to manufacture the lighting fixture with the same flexibility of lumen output to suit the lighting application. The particular design of the light sheet enables the light sheet to be a cost-effective solution.

Alternatively, a single 2×4 foot light sheet (or sheet of any size) may be employed that is, in itself, the fixture without any enclosure.

The light sheets are easily controlled to be automatically dimmed when there is ambient sunlight so that the overall energy consumption is greatly reduced. Since individual light sheets may have combinations of series and parallel strings, it is also possible to create sub-light sheet local dimming. Other energy saving techniques are also discussed herein.

The LEDs used in the light sheet may be conventional LEDs or may be any type of semiconductor light emitting device such as laser diodes, etc. Work is being done on developing solid state devices where the chips are not diodes, and the present invention includes such devices as well.

The flexible light sheets may be arranged flat in a support frame, or the light sheets may be bent in an arc for more directed light. Various shapes of the light sheets may be used for different applications. The top flex circuit sheet or the intermediate sheet may have optical features molded into it for collimating the light, spreading the light, mixing the light, or providing any other optical effect.

Other variations are described herein.

BRIEF DESCRIPTION OF THE DRAWINGS

The below described drawings are presented to illustrate some possible examples of the invention.

FIG. 1 is a simplified perspective view of a portion of the light output side of a light sheet in accordance with one embodiment of the invention.

FIG. 2 is a simplified perspective view of a portion of the underside of a light sheet in accordance with one embodiment of the invention.

FIGS. 3-5, 7, 8, 10-14, and 16-19 are cross-sectional views along line 3-3 in FIG. 1 showing the light sheet at various stages of fabrication and various embodiments.

FIG. 3A illustrates the flexible bottom substrate having conductors and electrodes, where the electrodes are heat conducting vias through the substrate.

FIG. 3B illustrates a reflective bottom substrate having conductors and electrodes, where the reflector may be an aluminum layer.

FIG. 3C illustrates a reflective bottom substrate having conductors and electrodes, where the reflector is a dielectric and where the electrodes are heat conducting vias through the substrate.

FIG. 4 illustrates a conductive adhesive dispensed over the substrate electrodes.

FIG. 5 illustrates bare LED chips, emitting blue light, affixed to the substrate electrodes.

FIG. 6 is a perspective view of a transparent intermediate sheet having holes for the LEDs. The sheet may optionally have a reflective bottom surface.

FIG. 7 illustrates the intermediate sheet affixed over the bottom substrate.

FIG. 10 illustrates a conductive adhesive dispensed over the LEDs' top electrodes.

FIG. 11 illustrates the top substrate laminated over the LEDs, where side light is reflected through the light output surface of the light sheet by prisms molded into the intermediate sheet.

FIG. 13 illustrates the use of a flip chip LED in the light sheet, where the flip chip may be used in any of the embodiments described herein.

FIG. 14 illustrates the reverse mounting of alternate LEDs on the bottom substrate to achieve a series connection between LEDs.

FIG. 16 illustrates the LEDs inserted into the holes of the intermediate sheet and the electrodes on the intermediate sheet being interconnected together by a conductor pattern on any of the layers for connecting the LEDs in any combination of serial and parallel.

FIG. 17 illustrates two light rays being reflected off the reflective electrodes on the intermediate sheet or the bottom reflective electrode of the LED and being converted to white light by a phosphor layer.

FIG. 18 illustrates an alternative embodiment where the conductors for interconnecting the LEDs are formed on opposite surfaces of the intermediate sheet or on surfaces of the top and bottom substrates.

FIGS. 20-31 illustrate another set of embodiments where no intermediate sheet is used.

FIG. 21C illustrates the sandwiched LED of FIG. 21A.

FIG. 22 is a cross-sectional view of a substrate structure having a hemispherical top substrate, where the structure contains a series string of LEDs sandwiched between two substrates.

FIGS. 23A and 23B are cross-sectional views of a substrate structure where a channel or cavity is formed in the top substrate, where the structure contains a series string of LEDs sandwiched between two substrates. FIG. 23B also shows the use of an external phosphor layer on the top substrate outer surface.

FIG. 24 is a schematic view of a series string of LEDs that may be in the substrate structures of FIGS. 20-23.

FIG. 25 is a top down view of a single substrate structure or a support base supporting multiple substrate structures.

FIG. 27 is a cross-sectional view of an LED that emits light from opposing sides of the chip, where the structure contains a series string of LEDs sandwiched between two substrates.

FIG. 28 illustrates a phosphor technique where the phosphor over the top of the LED chips is provided on the top substrate. FIG. 28 also illustrates an optical sheet over the top substrate that creates any desired emission pattern.

FIG. 29 illustrates a top substrate that is formed to have a hemispherical remote phosphor and reflecting grooves for reflecting side light toward a light output surface.

FIG. 30A illustrates an end of a sheet or strip where the bottom substrate is extended to provide connection terminals leading to the anode and cathode conductors on the top and bottom substrates for connection to a power supply or to another string of LEDs.

FIG. 30B is a top down view of FIG. 30A illustrating an example of the connection terminals at one end of a sheet or strip.

FIG. 31 is a side view of a portion of a longer strip of LEDs showing anode and cathode connection terminals at the ends of two serial strings of LEDs within the strip so the strings can be either connected together in series or parallel, or connected to other strings in other strips, or connected to a power supply.

FIG. 32 is a perspective view of a frame for supporting a flexible light sheet strip or sheet to selectively direct light.

Any of the various substrates and intermediate layers may be mixed and matched in other embodiments Elements that are the same or similar are labeled with the same numerals.

DETAILED DESCRIPTION

Figure 8A:
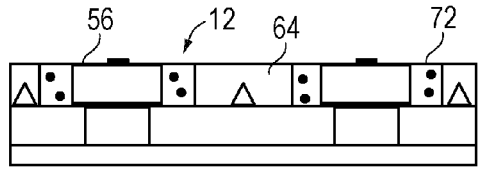
FIG. 8A illustrates the holes surrounding the LEDs filled with a silicone/phosphor mixture to encapsulate the LEDs.

FIG. 1 is a perspective view of a portion of the light output side of a light sheet 10, showing a simplified pseudo-random pattern of LED areas 12. The LED areas 12 may instead be in an ordered pattern. There may be 500 or more low power LEDs in a full size 2×4 foot light sheet to generate the approximately 3700 lumens (per the DOE CALiPER benchmark test) needed to replace a standard fluorescent fixture typically found in offices.

The pseudo-random pattern may repeat around the light sheet 10 (only the portion within the dashed outline is shown). A pseudo-random pattern is preferred over an ordered pattern since, if one or more LEDs fail or have a poor electrical connection, its absence will be significantly harder to notice. The eye is drawn to defects in an ordered patterns where spacings are consistent. By varying the spacing in a pseudo-random pattern such that overall light uniformity is achieved and where there may be a low amplitude variation in luminance across the surface of the fixture, then the loss of any one LED would not be perceived as a break in the pattern but blend in as a small drop in local uniformity. Typical viewers are relatively insensitive to local low gradient non-uniformities of up to 20% for displays. In overhead lighting applications, the tolerable levels are even higher given that viewers are not prone to staring at fixtures, and the normal angle of view is predominantly at high angles from the normal, where non-uniformities will be significantly less noticeable.

An ordered pattern may be appropriate for applications where there is a substantial mixing space between the light sheet and the final tertiary optical system which would obscure the pattern and homogenize the output adequately. Where this would not be the case and there is a desire to have a thinner profile fixture, then the pseudo random pattern should be employed. Both are easily enabled by the overall architecture.

Alternatively, a variably ordered pattern of LED areas 12 may modulate across the light sheet 10.

The light sheet 10 is generally formed of three main layers: a bottom substrate 14 having an electrode and conductor pattern; an intermediate sheet 16 acting as a spacer and reflector; and a transparent top substrate 18 having an electrode and conductor pattern. The LED chips are electrically connected between electrodes on the bottom substrate 14 and electrodes on the top substrate 18. The light sheet 10 is very thin, such as a few millimeters, and is flexible.

FIG. 2 is a perspective view of a portion of the underside of the light sheet 10 showing the electrode and conductor pattern on the bottom substrate 14, where, in the example, the LED chips in the LED areas 12 are connected as two groups of parallel LEDs that are connected in series by conductors not shown in FIG. 2. The series connections may be by vias through the light sheet layers or through switches or couplings in the external connector 22. A conductor pattern is also formed on the top substrate 18 for connection to the LED chips' top electrodes. The customizable interconnection of the LED chips allows the drive voltage and current to be selected by the customer or requirements of the design. In one embodiment, each identical group of LED chips forms a series-connected group of LED chips by the conductor pattern and the external interconnection of the conductors, and the various groups of series connected LED chips may then be connected in parallel to be driven by a single power supply or driven by separate power supplies for high reliability. In yet another embodiment, the LED chips could be formed into a series-parallel connected mesh with additional active components as may be needed to distribute current amongst the LEDs in a prescribed fashion.

In one embodiment, to achieve a series connection of LED chips using top and bottom conductors, some LEDs chips are mounted on the bottom substrate with their anodes connected to the bottom substrate electrodes and other LED chips are mounted with their cathodes connected to the bottom electrodes. Ideally, adjacent LED chips are reversely mounted to simplify the series connection pattern. The conductor between the electrodes then connects the LED chips in series. A similar conductor pattern on the top substrate connects the cathodes of LED chips to the anodes of adjacent LED chips.

An DC or AC power supply 23 is shown connected to the connector 22. An input of the power supply 23 may be connected to the mains voltage. If the voltage drop of an LED series string is sufficiently high, the series string of LEDs may be driven by a rectified mains voltage (e.g., 120 VAC).

In another embodiment, it is also possible to connect the LED chips in two anti-parallel series branches, or derivatives thereof, that will enable the LED chips to be driven directly from AC, such as directly from the mains voltage.

FIGS. 3-5, 7, 8, 10-14, and 16-19 are cross-sectional views along line 3-3 in FIG. 1, cutting across two LED areas 12, showing the light sheet at various stages of fabrication and various embodiments.

FIG. 3A shows a bottom substrate 14, which may be a commercially available and customized flex circuit. Any suitable material may be used, including thin metals coated with a dielectric, polymers, glass, or silicones. Kapton™ flex circuits and similar types are commonly used for connecting between printed circuit boards or used for mounting electronic components thereon. The substrate 14 has an electrically insulating layer 26, a patterned conductor layer 28, and metal electrodes 30 extending through the insulating layer 26. The electrodes 30 serve as heat sinking vias. Flexible circuits with relatively high vertical thermal conductivities are available. The substrate 14 is preferably only a few mils thick, such as 1-5 mils (25-125 microns), but may be thicker (e.g., up to 3 mm) for structural stability. The conductor layer 28 may be plated copper or aluminum. The electrodes 30 are preferably copper for high electrical and thermal conductivity. The conductor layer 28 may instead be formed on the top surface of the substrate 14.

The conductor layer 28 may be any suitable pattern, such as for connecting the LED chips in series, parallel, or a combination, depending on the desired power supply voltage and current, and depending on the desired reliability and redundancy.

FIG. 3B illustrates another embodiment of a bottom substrate 32, which has a metal reflective layer 34 (e.g., aluminum) sandwiched between a top insulating layer 36 and a bottom insulating layer 38. A conductor layer 40 and electrodes 42 are formed over the top insulating layer 36. The thickness of the bottom substrate 32 may be 1-5 mils, or thicker, and flexible.

FIG. 3C illustrates another embodiment of a bottom substrate 44, which has a dielectric reflective layer 46. This allows the heat conducting metal electrodes 47 to be formed through the reflective layer 46. A conductor layer 48 is formed on the bottom of the substrate, but may instead be formed on the top surface of the substrate. An optional insulating layer 50 overlies the reflective layer 46.

Suitable sheets having a reflective layer may be MIRO IV™, Vikuiti DESR™, or other commercially available reflective sheets.

In one embodiment, components of the drive circuitry may be patterned directly on the bottom substrate 44 to avoid the need for separate circuits and PCBs.

FIG. 4 illustrates a conductive adhesive 52, such as epoxy infused with silver, applied over the electrodes 30. Such a conductive adhesive 52 simplifies the LED chip bonding process and increases reliability. Any of the bottom substrates described herein may be used, and only the bottom substrate 14 of FIG. 3A is used in the examples for simplicity.

FIG. 5 illustrates commercially available, non-packaged blue LED chips 56 being affixed to the bottom substrate 14 by a programmed pick-and-place machine or other prescribed die placement method. The LED chips 56 have a small top electrode 58 (typically used for a wire bond) and a large bottom electrode 60 (typically reflective). Instead of a conductive adhesive 52 (which may be cured by heat or UV) affixing the bottom electrode 60 to the substrate electrode 30, the bottom electrode 60 may be ultrasonically welded to the substrate electrode 30, solder reflowed, or bonded in other ways. Suitable GaN LED chips 56 with a vertical structure are sold by a variety of manufacturers, such as Cree Inc., SemiLEDs, Nichia Inc., and others. Suitable Cree LEDs include EZ 290 Gen II, EZ 400 Gen II, EZ Bright II, and others. Suitable SemiLEDs LEDs include the SL-V-B15AK. Such LEDs output blue light, have a top area of less than about 350×350 microns, and a have a thickness of 170 microns. The specifications for some suitable commercially available blue LEDs, in combination with phosphors to create white light, identify a lumens output in the range of 5-7 lumens per LED at a color temperature of about 4,100K.

Other types of LED chips are also suitable, such as LED chips that do not have a top metal electrode for a wire bond. Some suitable LED chips may have a transparent top electrode or other electrode structures.

FIG. 6 is a perspective view of a transparent intermediate sheet 64 having holes 66 for the LED chips 56. Although the LED chips 56 themselves may have edges on the order of 0.3 mm, the holes 66 should have a much larger opening, such as 2-5 mm to receive a liquid encapsulant and sufficient phosphor to convert the blue light to white light or light with red and green, or yellow, components. The thickness of the intermediate sheet 64 is approximately the thickness of the LED chips 56 used, since the intermediate sheet 64 has one function of preventing excess downward pressure on the LED chips 56 during lamination. Transparent sheets formed of a polymer, such as PMMA, or other materials are commercially available in a variety of thicknesses and indices of refraction.

In one embodiment, the bottom surface of the intermediate sheet 64 is coated with a reflective film (e.g., aluminum) to provide a reflective surface. The intermediate sheet may also optionally have a further coating of dielectric to prevent electrical contact with traces and to prevent oxidation during storage or handling.

To adhere the intermediate sheet 64 to the bottom substrate 14, the bottom surface of the intermediate sheet 64 may be coated with a very thin layer of silicone or other adhesive material. The silicone may improve the total internal reflection (TIR) of the interface by selection of a suitably low index of refraction relative to the intermediate sheet 64.

FIG. 7 illustrates the intermediate sheet 64 having been laminated over the bottom substrate 14 under pressure. Heat may be used to cure the silicone. The thickness of the intermediate sheet 64 prevents a potentially damaging downward force on the LED chips 56 during lamination.

In one embodiment, the intermediate sheet 64 is molded to have prisms 70 formed in its bottom surface for reflecting light upward by TIR. If the bottom surface is additionally coated with aluminum, the reflection efficiency will be improved. Instead of, or in addition to, a prism pattern, the bottom surface may be roughened, or other optical elements may be formed to reflect the light through the light output surface.

FIG. 8A illustrates the area 12 surrounding the LED chips 56 filled with a silicone/phosphor mixture 72 to encapsulate the LED chips 56. The mixture 72 comprises phosphor powder in a curable liquid silicone or other carrier material, where the powder has a density to generate the desired amount of R, G, or Y light components needed to be added to the blue light to create a white light having the desired color temperature. A neutral white light having a color temperature of 3700-5000K is preferred. The amount/density of phosphor required depends on the width of the opening surrounding the LED chips 56. One skilled in the art can determine the proper types and amounts of phosphor to use, such that the proper mixture of blue light passing through the phosphor encapsulant and the converted light achieves the desired white color temperature. The mixture 72 may be determined empirically. Suitable phosphors and silicones are commercially available. The mixture 72 may be dispensed by silk screening, or via a syringe, or by any other suitable process. The dispensing may be performed in a partial vacuum to help remove any air from the gap around and under the LED chips 56. The conductive adhesive 52 (FIG. 4) helps fill in air gaps beneath the LED chips 56.

In another embodiment, the phosphor around the LED chips 56 in the holes may be preformed and simply placed in the holes around the LED chips 56.

Instead of the intermediate sheet 64 having holes with straight sides, the sides may be angled or be formed as curved cups such that reflectance of light outwards is enhanced.

Figure 8B:
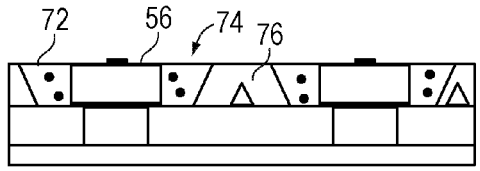
FIG. 8B illustrates the holes surrounding the LEDs filled with a silicone/phosphor mixture, where the holes are tapered to reflect light toward the light output surface of the light sheet.

FIG. 8B illustrates the area surrounding the LED chips 56 filled with the silicone/phosphor mixture 72, where the holes 74 in an intermediate sheet 76 are tapered to reflect light toward the light output surface of the light sheet.

All the various examples may be suitably modified if the phosphor is provided by the LED manufacturer directly on the LED chips 56. If the LED chips 56 are pre-coated with a phosphor, the encapsulant may be transparent silicone or epoxy.

Even if the LED chips 56 are not perfectly centered within a hole 66/74, the increased blue light passing through a thin phosphor encapsulant will be offset by the decreased blue light passing through the thicker phosphor encapsulant.

Figure 8C:
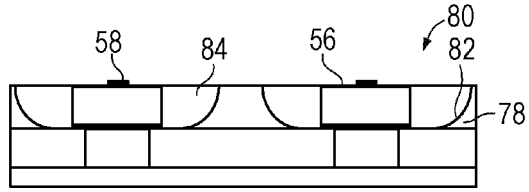
FIG. 8C illustrates the intermediate sheet molded to have cups surrounding each LED, where a reflective layer is formed on the cups to reflect light toward the light output surface of the light sheet.

FIG. 8C illustrates an intermediate sheet 78 molded to have cups 80 surrounding each LED chip 56, where a reflective layer 82 (e.g., aluminum with an insulating film over it) is formed over the sheet 78 to reflect light toward the light output surface of the light sheet. In the embodiment shown, the cups 80 are filled with a silicone encapsulant 84 rather than a silicone/phosphor mixture, since a phosphor tile will be later affixed over the entire cup to convert the blue light to white light. In another embodiment, the cups 80 may be filled with a silicone/phosphor mixture.

Figure 8D:
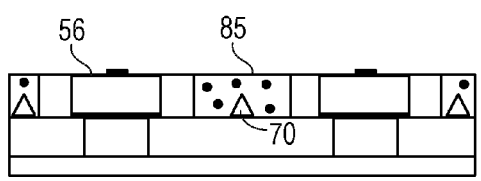
FIG. 8D illustrates the intermediate sheet being formed of phosphor or having phosphor powder infused in the intermediate sheet.

FIG. 8D illustrates an embodiment where the intermediate sheet 85 is formed of a phosphor or is infused with a phosphor powder. For example, the intermediate sheet 85 may be a molded silicone/phosphor mixture. Since the light generated by phosphor widely scatters, the prisms 70 used in other embodiments may not be needed.

Figure 8E:
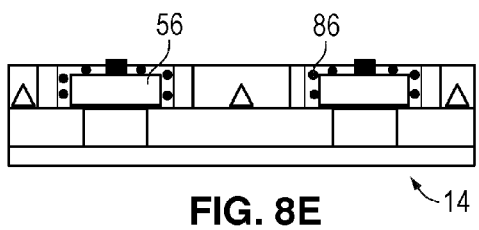
FIG. 8E illustrates that the LED chips may be pre-coated with phosphor on any sides of the chips.

FIG. 8E illustrates that the LED chips 56 may be pre-coated with phosphor 86 on any sides of the chips, such as on all light-emitting sides or only on the sides and not on the top surface. If the top surface is not coated with a phosphor, such as to not cover the top electrode, the blue light emitted from the top surface may be converted by a remote phosphor overlying the LED chip 56.

Figure 9:
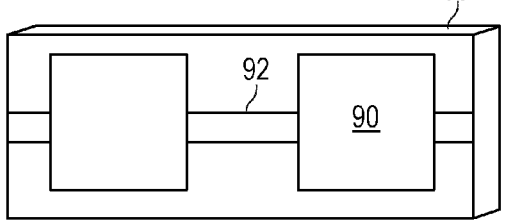
FIG. 9 is a perspective view of a top transparent substrate having a conductor pattern and electrode pattern. The electrodes may be reflective or transparent.

FIG. 9 is a perspective view of a transparent top substrate 88 having electrodes 90 and a conductor layer 92 formed on its bottom surface. The electrodes 90 may be reflective (e.g., silver) or transparent (e.g., ITO). The top substrate 88 may be any clear flex circuit material, including polymers. The top substrate 88 will typically be on the order of 1-20 mils thick (25 microns-0.5 mm). Forming electrodes and conductors on flex circuits is well known.

A thin layer of silicone may be silk-screened, sprayed with a mask, or otherwise formed on the bottom surface of the top substrate 88 for affixing it to the intermediate sheet 64. The electrodes 90 are preferably not covered by any adhesive in order to make good electrical contact with the LED chip electrodes 58.

Figure 10:
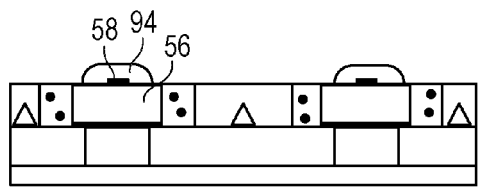

FIG. 10 illustrates a conductive adhesive 94 (e.g., silver particles in epoxy or silicone) dispensed over the top electrodes 58 of the LED chips 56.

Figure 11:
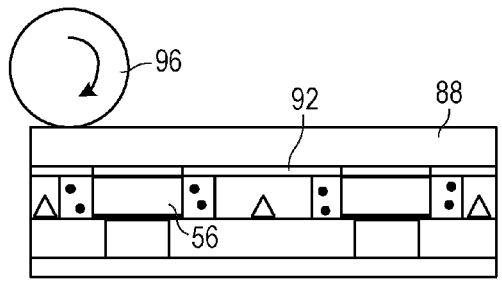

FIG. 11 illustrates the transparent top substrate 88 laminated over the LED chips 56, using pressure and heat. Heat is optional, depending on the type of curing needed for the various adhesives. A roller 96 is shown for applying uniform pressure across the light sheet as the light sheet or roller 96 is moved. Other means for applying pressure may be used, such as a flat plate or air pressure. The thickness of the intermediate sheet 64, matched to the thickness of the LED chips 56, ensures that the laminating force does not exert a pressure on the LED chips 56 above a damaging threshold. In the preferred embodiment, the force exerted on the LED chips 56 is substantially zero, since the conductive adhesive 94 is deformable to ensure a good electrical connection. Further, even if there is some slight protrusion of the LED chip electrode 58 above the intermediate sheet 64, the elasticity of the top substrate 88 will absorb the downward laminating pressure.

The thickness of the completed light sheet may be as little as 1-2 mm or less, resulting in little optical absorption and heat absorption. For added structural robustness, the light sheet can be made thicker. If additional optics are used, such as certain types of reflecting cups and light-shaping layers, the total thickness can become up to 1 cm and still maintain flexibility. The structure is cooled by ambient air flow over its surface. Any of the substrates and intermediate sheets described herein can be mixed and matched depending on the requirements of the light sheet.

FIGS. 12A-12D illustrate various phosphor conversion techniques that can be used to create white light. If UV LED chips are used, an additional phosphor generating a blue light component would be used.

Figure 12A:
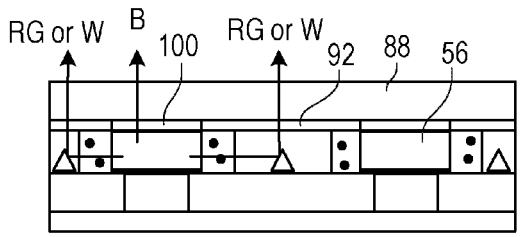
FIG. 12A illustrates the top substrate laminated over the LEDs, where side light is converted to a combination of red and green light, or yellow light, or white light and reflected through the light output surface of the light sheet, while the blue light from the LEDs is directly transmitted through the transparent electrodes on the top transparent substrate for mixing with the converted light.

FIG. 12A illustrates the LED chips' side light being converted to red and green light, or yellow light, or white light and reflected through the light output surface of the light sheet, while the blue light from the LED chips 56 is directly transmitted through the transparent electrode 100 on the transparent sheet 88 for mixing with the converted light a short distance in front of the light sheet. An observer would perceive the light emitted by the light sheet as being substantially uniform and white.

Figure 12B:
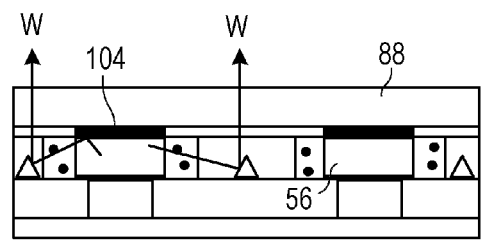
FIG. 12B illustrates the top substrate laminated over the LEDs, where a reflector overlies the LED so that all light is converted to white light by the phosphor and reflected through the light output surface of the light sheet.

FIG. 12B illustrates all the light from the LED chips 56 being emitted from the side due to a reflective electrode 104 on the top transparent sheet 88 overlying the LED chips 56. All light is then converted to white light by the phosphor and reflected through the light output surface of the light sheet.

Figure 12C:
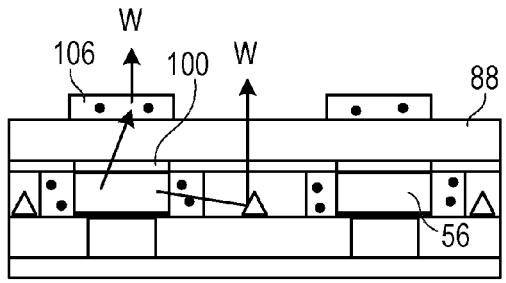
FIG. 12C illustrates the top substrate laminated over the LEDs, where side light is converted to white light by the phosphor surrounding the LEDs, and the top light is converted to white light by a remote phosphor layer over the LEDs.

FIG. 12C illustrates side light being converted to white light by the phosphor surrounding the LED chips 56, and the blue top light, emitted through the transparent electrode 100, being converted to white light by a remote phosphor layer 106 formed on the top surface of the top substrate 88 over the LED chips 56. The phosphor layer 106 may be flat or shaped. The area of the phosphor layer 106 is preferable the same as or slightly larger than the LED chips 56. The phosphor layer 106 can be rectangular or circular. The phosphor layer 106 is formed such that blue light passing through the phosphor layer 106 combined with the converted light produces white light of the desired color temperature.

Figure 12D:
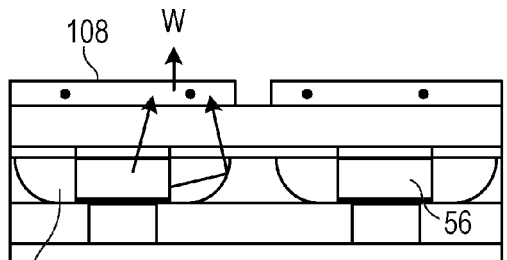
FIG. 12D illustrates the top substrate laminated over the LEDs, where the LEDs are positioned in a reflective cup, and where side light and top light are converted to white light by a large phosphor layer over the LEDs.

FIG. 12D illustrates the LED chips 56 being positioned in reflective cups 80 filled with a transparent silicone encapsulant, and where side light and top light are converted to white light by a large phosphor layer 108 over each cup 80. In one embodiment, the area of each phosphor layer 108 is adjusted to allow a selected amount of blue light to be directly emitted (not passed through the phosphor) to create the desired white light color temperature. Such phosphor layer sizes can be custom tailored at the end of the fabrication process, such as by masking or cutting phosphor tile sizes, to meet a customer's particular requirements for color temperature.

The top substrate 88 (or any other sheets/substrates described herein) may have a roughened top or bottom surface for increasing the extraction of light and providing a broad spread of light. The roughening may be by molding, casting, or micro bead blasting.

Figure 13:
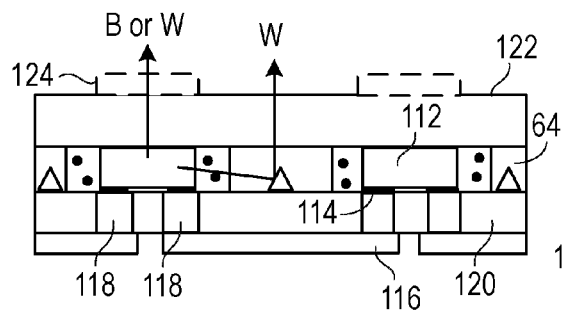

In another embodiment, shown in FIG. 13, the LED chips 112 may be flip chips, with anode and cathode electrodes 114 on the bottom surface of the LED chips 112. In such a case, all conductors 116 and electrodes 118 would be on the bottom substrate 120. This would greatly simplify the series connection between LED chips, since it is simple to design the conductors 116 to connect from a cathode to an anode of adjacent LED chips 112. Having all electrodes on the bottom substrate 120 also improves the reliability of electrical connections of the substrate electrodes to the LED electrodes since all bonding may be performed conventionally rather than by the lamination process. The top substrate 122 may then be simply a clear foil of any thickness. The top substrate 122 may employ the reflectors (from FIG. 12B) above each LED chip 112 for causing the chips to only emit side light, or a phosphor layer 124 can be positioned on the substrate 122 above each LED chip 112 for converting the blue light into white light, or any of the other phosphor conversion techniques and intermediate sheets described herein may be used to create white light.

In another embodiment, LED chips are used where both electrodes are on the top of the chip, where the electrodes are normally used for wire bonding. This is similar to FIG. 13 but where the LEDs are flipped horizontally and the conductors/electrodes are formed on the top substrate 122. The bottom substrate 120 (FIG. 13) may contain metal vias 118 for heat sinking, where the vias 118 are bonded to a bottom of the LED chips to provide a thermal path between the LED chips and the metal via 118 surface exposed on the bottom surface of the bottom substrate. The chips can then be air cooled. A thermally conductive adhesive may be used to adhere the LED chips to the vias 118.

Figure 14:
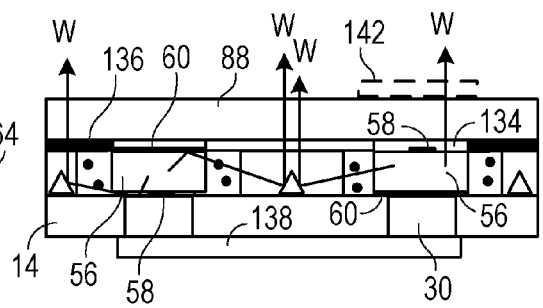

FIG. 14 illustrates LED chips 56 that are alternately mounted on the bottom substrate 14 so that some have their cathode electrodes 60 connected to the bottom substrate electrodes 30 and some have their anode electrodes 58 connected to the bottom substrate electrodes 30. The top substrate 88 transparent electrodes 134 then connect to the LED chips' other electrodes. Since the LED chips' cathode electrode 60 is typically a large reflector, the LED chips connected with their cathodes facing the light output surface of the light sheet will be side emitting. The electrodes 30 on the bottom substrate 14 are preferably reflective to reflect light upward or sideward. The connectors 136 on the top substrate 88 and the connectors 138 on the bottom substrate 14 can then easily connect the adjacent LED chips in series without any vias or external connections. For converting the top blue light from some LED chips to white light, a phosphor layer 142 may be used above the LED chips.

FIGS. 15-18 illustrate other embodiments that better enable the LED chips 56 to be connected in series within the light sheet 10.

Figure 15:
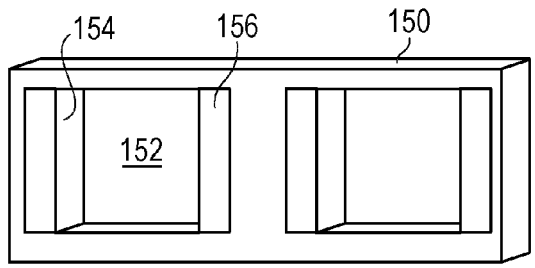
FIG. 15 illustrates the intermediate sheet having electrodes formed on opposing walls of its holes for contacting the top and bottom electrodes of the LEDs.

FIG. 15 illustrates an intermediate sheet 150 having square holes 152 with metal electrodes 154 and 156 formed on opposing walls of the holes 152, where the electrode metal wraps around a surface of the intermediate sheet 150 to be contacted by a conductor pattern on the surface of the intermediate sheet 150 or one or both of the top substrate or bottom substrate. The electrodes may be formed by printing, masking and sputtering, sputtering and etching, or by other known methods.

Figure 16:
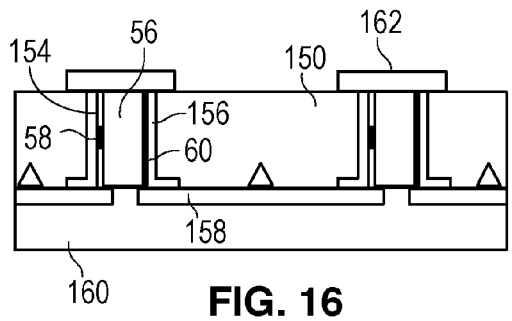

As shown in FIG. 16, the LED chips 56, with top and bottom electrodes, are then inserted vertically in the holes 152 so that the LED electrodes 58 and 60 contact the opposing electrodes 154 and 156 formed on the walls of the holes 152. The electrodes 154 and 156 may be first coated with a conductive adhesive, such as silver epoxy, to ensure a good contact and adhesion. The intermediate sheet 150 has about the same thickness of the chips 56, where the thickness of the chips 56 is measured vertically. This helps protect the chips 56 from physical damage during lamination.

In the example of FIG. 16, the electrodes 154 and 156 extend to the bottom surface of the intermediate sheet 150 for being interconnected by conductors 158 formed on the bottom substrate 160. In one embodiment, the bottom substrate 160 has a metal reflector layer on its bottom surface or internal to the substrate for reflecting the side light back up through the light output surface of the light sheet. The reflective layer may also be a dielectric layer.

The conductors 158 in FIG. 16 connect the anode of one LED chip 56 to the cathode of an adjacent LED chip 56. The conductors 158 may additionally connect some series strings in parallel (or connect parallel LED chips in series).

Figure 17:
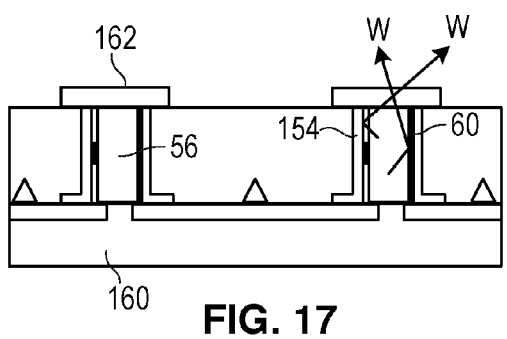

FIG. 17 illustrates two light rays generated by the LED chip 56 being reflected by the LED chip's bottom reflective electrode 60 and the reflective electrode 154 or reflective scattering conductive adhesive. Since the bottom substrate 160 also has a reflector, all light is forced through the top of the light sheet.

Any air gaps between the LED chips 56 and the holes 152 may be filled in with a suitable encapsulant that improves extraction efficiency.

A phosphor layer 162 converts the blue light to white light.

FIGS. 16 and 17 also represent an embodiment where the conductor pattern is formed directly on the bottom or top surface of the intermediate sheet 150, so all electrodes and conductors are formed on the intermediate sheet 150. No top substrate is needed in these embodiments, although one may be desired to seal the LED chips 56.

Figure 18:
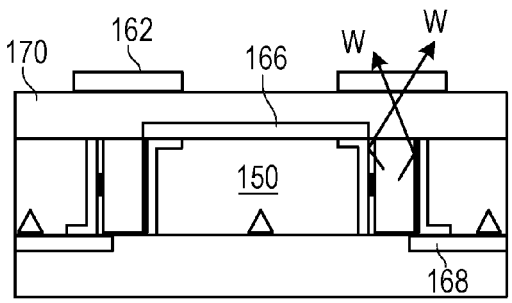

FIG. 18 illustrates an embodiment where the conductors 166 and 168 are formed on both sides of the intermediate sheet 150 or formed on the transparent top substrate 170 and bottom substrate 160. The LED chips 56 can easily be connected in any combination of series and parallel.

Figure 19A:
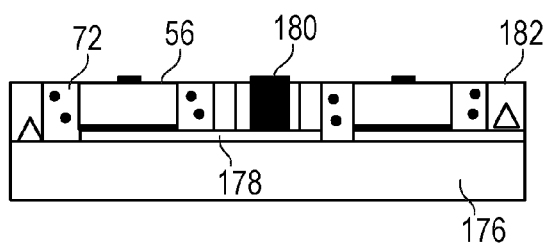
FIGS. 19A and 19B illustrate the LEDs being connected in series by a metal via bonded to a bottom electrode and extending through the intermediate layer.
Figure 19B:
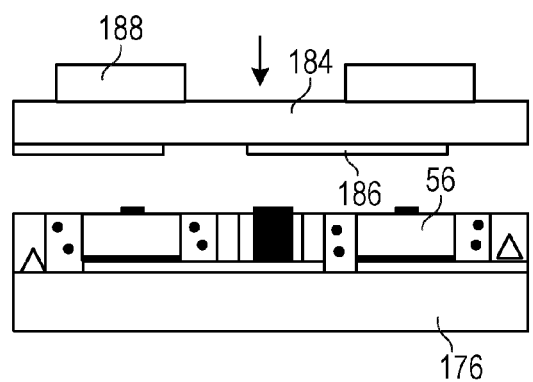

FIGS. 19A and 19B represent an embodiment where the bottom substrate 176 has conductors 178 formed on its top surface. The bottom electrodes (e.g., cathodes) of the LED chips 56 are bonded to the conductors 178. For a series connection between LED chips 56, solid metal interconnectors 180 are also bonded to the conductors 178. The intermediate sheet 182 has holes that correspond to the LED chip 56 locations and interconnector 180 locations, and the tops of the chips 56 and interconnectors 180 are approximately planar with the top of the intermediate sheet 182. The areas surrounding the LED chips 56 may be filled in with a phosphor/silicone mixture 72.

In FIG. 19B, a transparent top substrate 184 has anode conductors 186 that interconnect the anode electrodes of LED chips 56 to associated interconnectors 180 to create a series connection between LED chips 56. This series interconnection technique may connect any number of LED chips 56 in series in the sheet or strip. A pick and place machine is simply programmed to place an LED chip 56 or an interconnector 180 at selected locations on the bottom substrate 176. The bonding may be performed by ultrasonic bonding, conductive adhesive, solder reflow, or any other technique.

A phosphor layer or tile 188 may be affixed on the top substrate 184 over the LED chips 56 to convert the blue light emitted from the top surface of the chips 56 to white light. If the phosphor layer/tile 188 were large enough, then phosphor need not be used in the encapsulant.

The bottom substrate 176 may have a reflective layer either imbedded in it or on its bottom surface, as previously described, for reflecting light toward the light output surface.

FIGS. 20-31 illustrate various embodiments where there is no intermediate sheet or strip. Instead, the top substrate and/or bottom substrate is provided with cavities or grooves to accommodate the thickness of the LED chips 56.

Figure 20A:
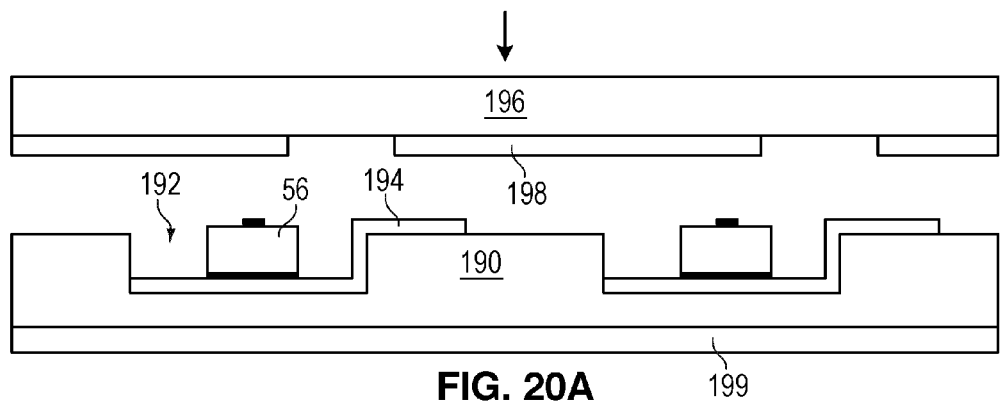
FIGS. 20A and 20B are cross-sectional views of a light sheet or strip, where a channel or cavity is formed in the bottom substrate, and where a series connection is made by conductors on two opposing substrates.
Figure 20B:
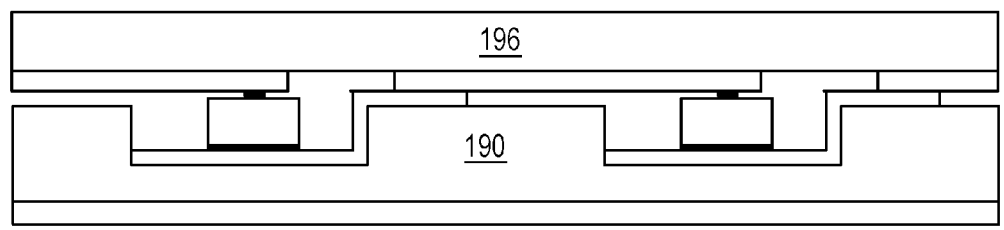

In FIGS. 20A and 20B, the bottom substrate 190 has cavities 192 molded in it or grooves molded in it. Grooves may also be formed by extruding, machining, or injection molding the substrate 190. The width of the bottom substrate 190 may be sufficient to support one, two, three or more columns of LED chips 56, where each column of chips 56 is connected in series, as described below.

Cathode conductors 194 are formed on the bottom substrate 190 and are bonded to the cathode electrodes of the vertical LED chips 56.

A top substrate 196 has anode conductors 198 that are aligned with the anode electrodes of the LED chips 56 and also make contact with the cathode conductors 194 to connect the LED chips 56 in series. The area around each LED chip 56 may be filled in with a phosphor/silicone mixture to encapsulate the chips 56, or just silicone may be used as the encapsulant and the top surface of the top substrate 196 is coated with a layer of phosphor to create white light.

FIG. 20B shows the top substrate 196 laminated onto the bottom substrate 190. A thin layer of silicone may be printed on the top substrate 196 or bottom substrate 190, except where the conductors are located, to affix the substrates to each other and to fill in any gaps between the two substrates. Alternatively, lamination may be achieved by use of other adhesive materials, ultrasonic bonding, laser welding, or thermal means. A conductive paste or adhesive may be deposited over the anode conductors 198 to ensure good electrical contact to the cathode conductors 194 and chips' anode electrodes. A phosphor tile or layer may be formed on the top substrate 196 for creating white light from the blue light emitted vertically from the chip 56. A reflective layer 199 is formed on the bottom substrate 190 for reflecting light toward the output surface.

Instead of the groove or cavity being formed in the bottom substrate 190, the groove or cavity may be formed in the top substrate 196, or partial-depth grooves or cavities may be formed in both substrates to account for the thickness of the chips 56.

Figure 20C:
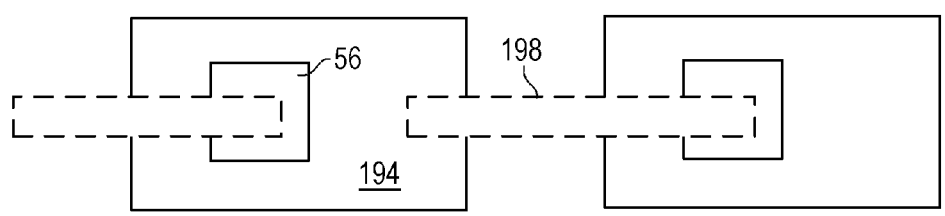
FIG. 20C is a transparent top down view of the structure of FIG. 20B showing the overlapping of anode and cathode conductors.
Figure 20C:
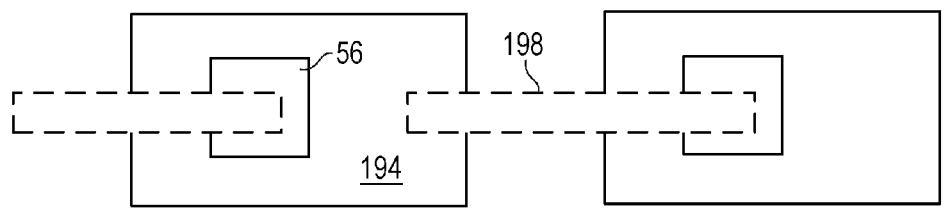

FIG. 20C is a transparent top down view of FIG. 20B illustrating one possible conductor pattern for the conductors 194 and 198, where the LED chips 56 are connected in series, and two sets of series-connected LED strings are shown within the laminated substrates. The anode conductors 198 above the LED chips 56 are narrow to block a minimum amount of light. The various metal conductors in all embodiments may be reflective so as not to absorb light. Portions of the anode conductors 198 over the LED chips 56 may be transparent conductors.

Figure 20D:
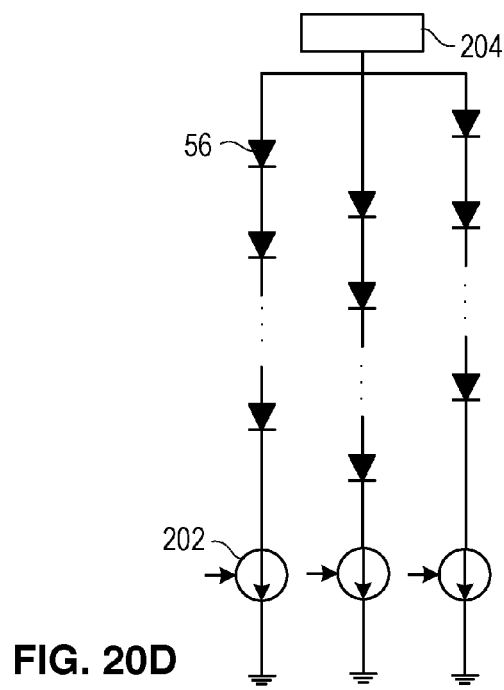
FIG. 20D illustrates multiple series strings of LEDs being connected in the light sheet or strip of FIG. 20B.

As shown in FIG. 20D, any number of LED chips 56 may be connected in series in a strip or sheet, depending on the desired voltage drop. Three series strings of LED chips 56 in a single strip or sheet are shown in FIG. 20D, each series string being connected to a controllable current source 202 to control the string's brightness. The LED chips 56 are offset so as to appear to be in a pseudo-random pattern, which is aesthetically pleasing and makes a failed LED chip not noticeable. If there is sufficient diffusion of the light, each string of LED chips may create the same light effect as a fluorescent tube. A cathode connector and an anode connector may extend from each strip or sheet for coupling to a power supply 204 or to another strip or sheet. This allows any configuration of series and parallel LED chips.

Figure 21A:
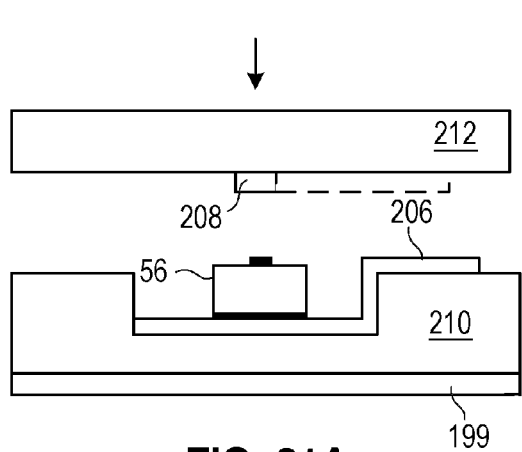
FIG. 21A is a cross-section of structure that contains a series string of LEDs sandwiched between two substrates.
Figure 21B:
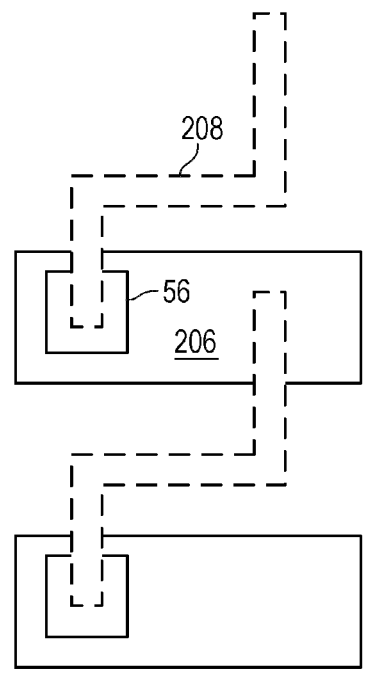
FIG. 21B is a top down view of the structure of FIG. 21A showing the overlapping of anode and cathode conductors.

FIGS. 21A, 21B, and 21C illustrate a different configuration of cathode conductors 206 and anode conductors 208 on a bottom substrate 210 and top substrate 212 for connecting the LED chips 56 in series when the substrates are brought together. In FIGS. 21A-C, there is only one LED chip 56 mounted along the width of the structure, and the flexible structure can be any length depending on the number of LED chips to connect in series and the desired distance between LED chips 56. In FIG. 21C, the LED chip 56 may be encapsulated in silicone or a phosphor/silicone mixture, and a phosphor tile or phosphor layer 214 is affixed over the LED chip 56 to generate white light. The phosphor layer 214 may be deposited over the entire top surface of the top substrate 212. The bottom substrate 210 has a reflective layer 199.

FIG. 22 illustrates that the top substrate 216 may be hemispherical with a phosphor layer 218 over the outer surface of the top substrate 216 for converting the blue LED light to white light. Silicone encapsulates the chip 56. By providing the top substrate 216 with a rounded surface, there is less TIR and the emitted white light pattern is generally lambertian. Also, for all embodiments, shaping the top substrate can be used to shape the light emission pattern. For example, the top substrate shape can act as a lens to produce a batwing or other non-lambertian emission pattern for more uniform illumination.

The diameters/widths of the substrates in FIGS. 21-22 and the substrates described below may be on the order of 2-10 mm to limit light attenuation, to maintain high flexibility, to minimize the height of the light fixture, and to enable handling of the substrates using conventional equipment. The substrates can, however, be any size.

FIGS. 23A and 23B illustrate that the groove 220 or cavity for the LED chip 56 may be formed in the top substrate 222 rather than in the bottom substrate 224.

The bottom substrate 224 may be widened to support any number of LED chips along its width, and a separate hemispherical top substrate 222 may be used to cover each separate series string of LED chips mounted on the single bottom substrate (shown in FIG. 25).

FIG. 24 is a schematic diagram representing that any number of LED chips 56 may be connected in a series string 225 in the substrate structure of FIGS. 21-23.

FIG. 25 illustrates a support base 226 for the separate strings 225 of LED chips 56. The support base 226 may be a bottom substrate, such as substrates 210 or 224 in FIGS. 21-23, or may be a separate support base for strings 225 encased in the top and bottom substrates shown in FIGS. 21-23. Each string 225 may be controlled by a separate current source 230 and powered by a single power supply voltage connected to the anodes of the strings 225. Many driving arrangements are envisioned. In one embodiment, the support base 226 is nominally 2×4 feet to be a replacement for a 2×4 foot standard ceiling fluorescent fixture. Since each series string 225 of LED chips 56 is very thin, any number of strings can be mounted on the support base 226 to generate the required number of lumens to substitute for a standard 2×4 foot fluorescent fixture.

Figure 26A:
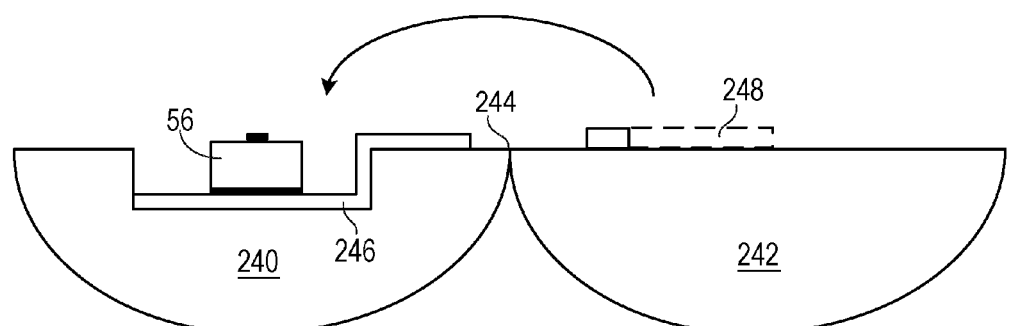
FIG. 26A is a cross-sectional view of two substrates connected together by a narrow region so the substrates can sandwich a string of LEDs.
Figure 26B:
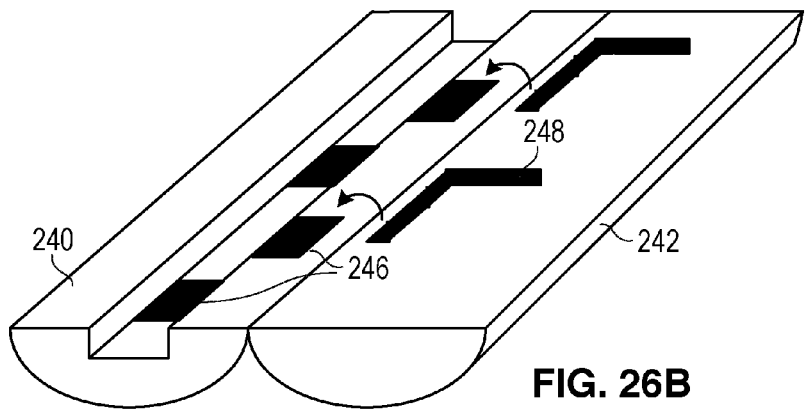
FIG. 26B is a perspective view of the substrates of FIG. 26A.
Figure 26C:
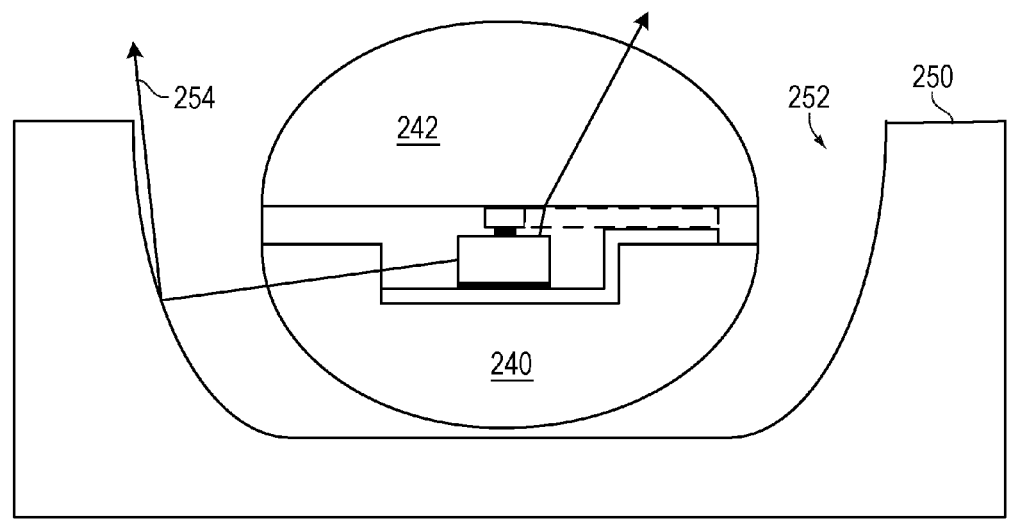
FIG. 26C illustrates the structure of FIG. 26A being supported in a reflective groove in a support base.

FIGS. 26A-26C illustrate a variation of the invention, where the substrates are connected together when initially molded or extruded. One or both substrates may be rounded.

In FIG. 26A, a bottom substrate 240 and a top substrate 242 are molded or extruded together and connected by a resilient narrow portion 244. This allows the top substrate 242 to be closed over the bottom substrate 240 and be automatically aligned. Cathode conductors 246 and anode conductors 248 are formed on the substrates 240 and 242 in the arrangement shown in FIG. 26B so that, when the substrates 240 and 242 are brought together, the LED chips 56 are connected in series. Silicone or a phosphor/silicone mixture may be used to encapsulate the LED chips 56, or the outer surface of the substrates is coated with a phosphor layer to convert the blue light to white light. Any number of LED chips 56 can be connected in series within the substrates.

FIG. 26C illustrates the resulting substrate structure affixed to a support base 250. The support base 250 may have a reflective groove 252 for reflecting light 254. The groove 252 may be repeated along the width of the support base 250 for supporting a plurality of substrate structures.

The bottom substrate 240 may have a flat bottom while the top substrate is hemispherical. This helps mounting the bottom substrate on a reflective support base. Providing the top substrate as hemispherical, with an outer phosphor coating, results in less TIR and a more lambertian emission.

Figure 27:
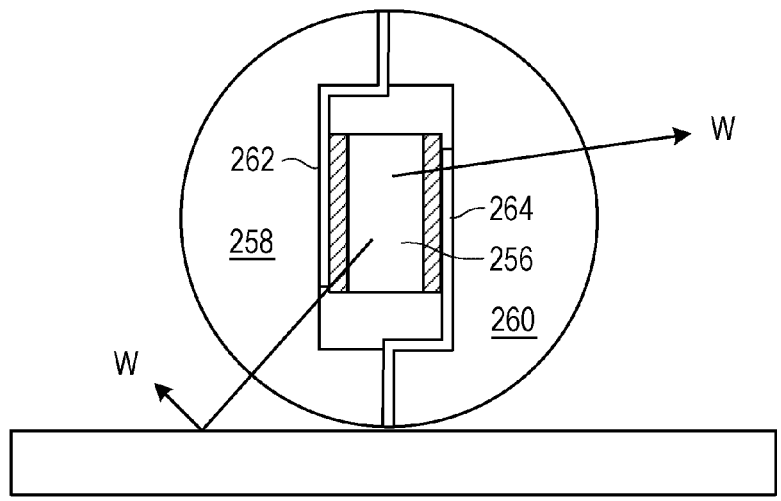

FIG. 27 illustrates the use of an LED chip 256 that emits light through all surfaces of the chip. For example, its cathode electrode may be a small metal electrode that contacts a transparent (e.g., ITO) current spreading layer. Such a chip 256 is sandwiched between two substrates 258 and 260 that have anode and cathode connectors 262 and 264 that contact the chips' electrodes and connect multiple chips in series, similar to the embodiments of FIGS. 20-26.

Figure 28:
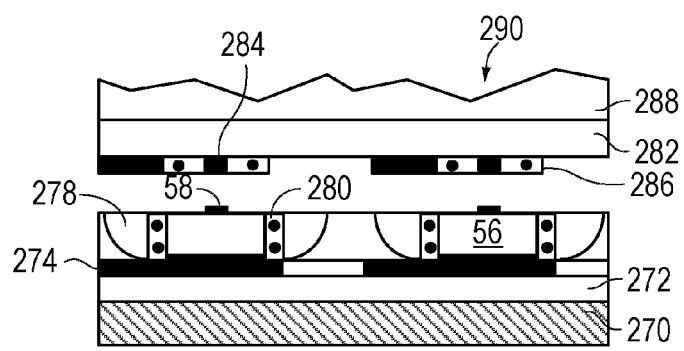

FIG. 28 illustrates an embodiment where the bottom substrate includes a reflective layer 270, such as aluminum, a dielectric layer 272, and conductors 274. The LED chips 56 are in reflective cups 278, such as molded cups with a thin reflective layer deposited in the cups. The cups 278 may be formed in a separate intermediate sheet that is laminated before or after the LED chips 56 are affixed to the bottom substrate. Phosphor 280 fills the area surrounding the LED chips 56. In one embodiment, the phosphor 280 may fill the entire cup 278 so that the cup 278 itself is the mold for the phosphor 280. In another embodiment, some or all of the light-emitting surfaces of the LED chips 56 are coated with phosphor 280 prior to the LED chips 56 being affixed on the bottom substrate.

The top substrate 282 has conductors 284 that contact the top electrodes 58 of the LED chips 56, and the conductors 274 and 284 may come in contact with each other using the various techniques described herein to connect the LED chips 56 in series. The top substrate 282 has formed on its surface a phosphor layer 286 that converts the LED chips' top-emitted light to white light. The top substrate 282 may have an optical layer 288 laminated over it. The optical layer 288 has a pattern 290 molded into it that is used to create any light emission pattern desired. The pattern 290 can be a Fresnel lens, diffuser, collimator, or any other pattern.

In one embodiment, the bottom substrate of FIG. 28 is 1-2 mm thick, the cup layer is 2-3 mm, the top substrate 282 is 1-2 mm, and the optical layer 288 is 2-3 mm, making the overall thickness about 0.6-1 cm.

Figure 29:
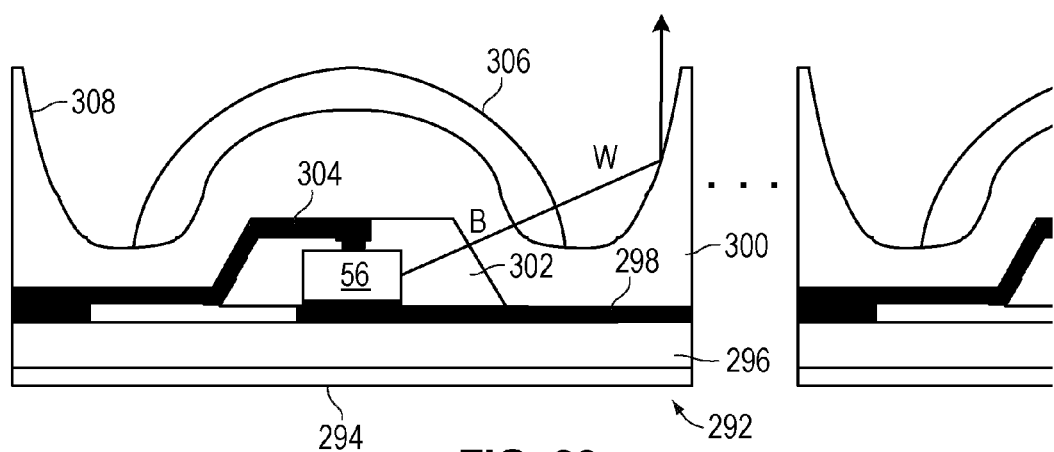

FIG. 29 illustrates a portion of a light sheet with a repeating pattern of strings of LED chips 56. The view of FIG. 29 is looking into an end of a series string of LED chips 56. A bottom substrate 292 includes a reflective layer 294 and a dielectric layer 296. Conductors 298 are formed on the dielectric layer 296, and LED chip electrodes are electrically connected to the conductors 298.

A top substrate 300 has cavities or grooves 302 that extend into the plane of FIG. 29 and contain many LED chips 56 along the length of the light sheet. If the top substrate 300 extends across the entire light sheet, there would be many straight or meandering grooves 302, where the number of grooves depends on the number of LED chips used. The top substrate 300 has conductors 304 that contact the top electrodes of the LED chips 56 and contact the conductors 298 on the bottom substrate 292 for creating series strings of LED chips 56 extending into the plane of FIG. 29. The series strings and light sheet structure may resemble that of FIG. 25, having an integral top substrate extending across the entire sheet. The conductors 304 may be transparent directly above the LED chips 56.

The portions of the top substrate 300 directly over the LED chips 56 have a phosphor coating 306 for generating white light. The top substrate 300 is molded to have reflecting walls 308 along the length of the string of LED chips to direct light outward to avoid internal reflections. The reflective walls 308 may have a thin metal layer. The top and bottom substrates may extend across an entire 2×4 foot light sheet. Alternatively, there may be a separate top substrate for each string of LED chips 56.

At the end of each series string of LED chips or at other points in the light sheet, the anode and cathode conductors on the substrates must be able to be electrically contacted for connection to a current source or to another string of LED chips, whether for a series or parallel connection. FIGS. 30A, 30B, and 31 illustrate some of the many ways to electrically connect to the various conductors on the substrates.

FIG. 30A illustrates an end of a sheet or strip where the bottom substrate 310 extends beyond the top substrate 312, and the ends of conductor 314 and 315 on the bottom substrate 310 are exposed. Substrate 310 is formed of a reflective layer 311 and a dielectric layer 313. FIG. 30B is a top down view of the end conductors 314 and 315 on the bottom substrate 310 and an end conductor 316 on the top substrate 312. The conductor 316 contacts the anode electrode of the LED chip 56 and contacts the conductor 315.

The ends of the exposed portions of the conductors 314 and 315 are thickly plated with copper, gold, silver, or other suitable material to provide connection pads 317 for solder bonding or for any other form of connector (e.g., a resilient clip connector) to electrically connect the anode and cathode of the end LED chip 56 to another string or to a power supply. The connection pads 317 may be electrically connected to a connector similar to the connector 22 in FIG. 2 so the connections to and between the various strings of LED chips 56 can be determined by the customized wiring of the connector 22 to customize the light sheet for a particular power supply.

FIG. 31 is a side view of a portion of a light sheet showing plated connection pads 318-321 formed along the bottom substrate 324 that lead to conductors, such as conductors 314 in FIG. 30A, on the bottom substrate 324. Pads 318 and 319 may connect to the anode and cathode electrodes of an LED chip at the end of one string of LED chips, and pads 320 and 321 may connect to the anode and cathode electrodes of an LED chip at the end of another string of LED chips. These pads 318-321 may be suitably connected to each other to connect the strings in series or parallel, or the strings may be connected to power supply terminals. In one embodiment, a string of LED chips consists of 18 LED chips to drop approximately 60 volts. The pads 318-321 may act as surface mounted leads soldered to a conductor pattern on a support base, since solder will wick up on the pads 318-321 while soldering to the conductor pattern. The pads 318-321 may also be connected using a resilient clip connector or other means. The pads 318-321 may also extend to the bottom surface of the substrate 324 for a surface mount connection.

In the various embodiments, the material for the substrates preferably has a relatively high thermal conductivity to sink heat from the low power LED chips. The bottom substrates may even be formed of aluminum with a dielectric between the conductors and the aluminum. The aluminum may be the reflector 199 in FIG. 20A or other figures. The backplane on which the LED/substrates are affixed may be thermally conductive.

The various conductors on the transparent top substrates may be metal until proximate to each LED chip, then the conductors become a transparent conductor (e.g., ITO) directly over the LED chip to not block light. A conductive adhesive (e.g., containing silver) may be used to bond the LED chips' anode electrode to the ITO.

The wavelength converting material, such as phosphor, can be infused in the top substrate, or coated on the top substrate, or used in the LED chip's encapsulant, or deposited directly over the LED chip itself, or formed as a tile over the LED, or applied in other ways.

The LED chips/substrate structures may be mounted on any suitable backplane that may include reflective grooves in a straight or meandering path. It is preferable that the LED chips appear to be in a pseudo-random pattern since, if an LED chip fails (typically shorts), it will not be noticeable to a viewer.

The top substrate may be molded with any optical pattern to shape the light emission. Such patterns include Fresnel lenses or holographic microstructures. Also, or instead, an additional optical sheet may be positioned in front of the substrate structures for shaping the light, such as diffusing the light, to meet the requirements of office lighting directed by the Illuminating Engineering Society of North America, Recommended Practice 1-Office Lighting (IESNA-RP1).

In addition, having a plurality of strips of LED chips, with the strips having different optical structures for different light emission patterns, could be used with a controller that controls the brightness of each strip to create a variable photometric output.

The number of LED chips, chip density, drive current, and electrical connections may be calculated to provide the desired parameters for total flux, emission shape, and drive efficiency, such as for creating a solid state light fixture to replace standard 2×4 foot fluorescent fixtures containing 2, 3, or 4 fluorescent lamps.

Since the substrates may be only a few millimeters thick, the resulting solid state luminaire may be less than 1 cm thick. This has great advantages when there is no drop ceiling or in other situations where space above the luminaire is limited or a narrow space is desirable.

In embodiments where there is a conductor over the LED chip, a phosphor layer may be deposited on the inside surface of the substrate followed by an ITO deposition over the phosphor so that LED light passes through the ITO then excites the phosphor.

To avoid side light from the LED chips becoming scattered in the substrates and attenuated, 45 degree reflectors, such as prisms, may be molded into the bottom substrate surrounding each LED chip, similar to the prisms 70 in FIG. 7, to reflect light toward the light output surface of the light sheet.

Since the substrates are flexible, they may be bent in circles or arcs to provide desired light emission patterns.

Although adhesives have been describe to seal the substrates together, laser energy, or ultrasonic energy may also be used if the materials are suitable.

It is known that LED chips, even from the same wafer, have a variety of peak wavelengths so are binned according to their tested peak wavelength. This reduces the effective yield if it is desired that the light sheet have a uniform color temperature. However, by adjusting the phosphor density or thickness over the various LED chips used in the light sheet, many differently binned LED chips can be used while achieving the same color temperature for each white light emission.

The LEDs used in the light sheet may be conventional LEDs or may be any type of semiconductor light emitting device such as laser diodes, etc. Work is being done on developing solid state devices where the chips are not diodes, and the present invention includes such devices as well.

Quantum dots are available for converting blue light to white light (the quantum dots add yellow or red and green components to create white light). Suitable quantum dots can be used instead of or in addition to the phosphors described herein to create white light.

To provide high color rendering, the direct emissions of LED chips in the light sheet emitting red and green light can be controlled to mix with the white light emitted by phosphor-converted LED chips to produce a composite light that achieves high color rendering and enables the possibility of tuning the light by independent or dependent control of the red and green LEDs by open loop deterministic means or closed loop feedback means or any combination thereof. In one embodiment, different strings of LED chips have different combinations of the red, green, and phosphor-converted LEDs, and the strings are controlled to provide the desired overall color temperature and color rendering.

Since the light sheet is highly flexible and extremely light, it may be retained in a particular shape, such as flat or arced, using a light-weight frame.

FIG. 32 is a perspective view of a plastic frame 330 for supporting the flexible light sheet strip or sheet 10 by its edges or over other portions of its surface (depending on the width of the light sheet) to selectively direct light toward an area directly under the light sheet. Other configurations are achievable. Thin sheets containing optical elements for further control of the light emission from the light sheet may be supported by the frame 330.

The light sheets are easily controlled to be automatically dimmed when there is ambient sunlight so that the overall energy consumption is greatly reduced. Other energy saving techniques may also be used.

The light sheet 10 may be used for overhead illumination to substitute for fluorescent fixtures or any other lighting fixture. Small light strips may be used under cabinets. Long light strips may be used as accent lighting around the edges of ceilings. The light sheets may be bent to resemble lamp shades. Many other uses are envisioned.

The standard office luminaire is a 2×4 foot ceiling troffer, containing two 32 watt, T8 fluorescent lamps, where each lamp outputs about 3000 lumens. The color temperature range is about 3000-5000 K. If low power LEDs are used (e.g., model SL-V-B15AK driven at 20 mA), a substitute luminaire would need about 580-620 chips for equivalence to the DOE CALiPER benchmark troffer. Assuming chip prices in the range of 3-5 cents, the total chip cost would be $17.50-$31. If the chips are operated at higher currents, say 30 mA, then the total chip count could be reduced by approximately one-third. Power conversion/driver efficiency is about 85%. Overall then, the lightsheet efficacy (120 V AC to total lumens out) would be 78-86 lm/W at 20 mA drive current and 3.2 V (compared to the benchmark T8 troffer performance of 63 lm/W). Accordingly, the invention can provide a practical, cost-effective solid state substitute for a conventional 2×4 foot troffer, while achieving improved performance and enabling a wide range of dimming.

The various features of all embodiments may be combined in any combination.

While particular embodiments of the present invention have been shown and described, it will be obvious to those skill in the art that changes and modifications may be made without departing from this invention in its broader aspects and, therefore, the appended claims are to encompass within their scope all changes and modifications that fall within the true spirit and scope of the invention.

What is claimed is:

1. A method for fabricating a lighting device comprising:
depositing a plurality of electrodes on a top surface of a first substrate;
forming conductors on a bottom surface of the first substrate opposite the top surface where the plurality of electrodes are deposited, the conductors being arranged to interconnect at least a portion of the plurality of electrodes through openings in the first substrate;
providing a plurality of light emitting diode (LED) dies, each LED die having an anode and a cathode formed on a same surface of the LED die;
affixing each LED die to the top surface of the first substrate to contact the cathode and anode of each LED die with an associated pair of electrodes from among the plurality of electrodes such that the plurality of LED dies are electrically interconnected;
forming metal vias extending through the first substrate, such that the LED dies are thermally coupled to the metal vias for sinking heat from the LED dies;
providing an intermediate sheet of a thickness approximately equal to a thickness of each LED die of the plurality of LED dies, the intermediate sheet comprising holes corresponding to locations of the LED dies on the first substrate, and
a plurality of prisms on a bottom surface of the intermediate sheet, the prisms being substantially co-planar with the plurality of LED dies and arranged between adjacent LED dies of the plurality of LED dies, and configured to redirect at least some light emitted through side walls of the LED dies;
applying the intermediate sheet over the top surface of the first substrate;
encapsulating each LED die by filling each hole with an encapsulant;
applying a transparent second substrate over the intermediate sheet; and
forming a plurality of tiles on the second substrate over corresponding plurality of LED dies,
wherein at least one of the encapsulant and the plurality of tiles include a wavelength conversion material for generating white light.

2. The method of claim 1, further comprising:
forming the lighting device in a flexible sheet corresponding to a 2 foot×4 foot ceiling luminaire,
wherein the plurality of LED dies are affixed to the top surface of the first substrate in a pseudo-random pattern, such that inoperability of any one of the plurality of LED dies does not substantially modify an illumination pattern emitted by the ceiling luminaire.

3. The method of claim 1, further comprising:
forming the lighting device in a strip, the strip having a longitudinal dimension longer than a transverse dimension, configured to provide light substantially the same to that produced by a T8 fluorescent lamp in a ceiling luminaire, wherein the plurality of dies are affixed to the top surface of the first substrate in a pseudo-random pattern, such that inoperability of any one of the plurality of dies does not substantially modify an illumination pattern emitted by the strips.

4. The method of claim 1, wherein at least some of the conductors are arranged to electrically interconnect some of the plurality of LED dies in series.

5. The method of claim 1, wherein each LED die of the plurality of LED dies has a reflector formed over a top surface of the LED die such that the LED dies only emit light through side walls of the LED dies.

6. The method of claim 1, wherein the first substrate comprises a reflector layer.

7. A lighting device comprising:
a flexible sheet comprising
a first substrate having a top surface and a bottom surface opposite the top surface, the first substrate comprising a plurality of electrodes disposed on the top surface, conductors disposed on the bottom surface at locations corresponding to locations of the plurality of electrodes, the conductors being arranged to interconnect at least a portion of the plurality of electrodes through openings in the first substrate;
a plurality of light emitting diode (LED) dies, each LED die having an anode and a cathode formed on a same surface of the LED die, and each LED die being affixed to the top surface of the first substrate to contact the cathode and anode of each LED die with an associated pair of electrodes from among the plurality of electrodes such that the plurality of LED dies are electrically interconnected,
wherein metal vias extend through the first substrate, such that the LED dies are thermally coupled to the metal vias for sinking heat from the LED dies;
an intermediate sheet of a thickness approximately equal to a thickness of each LED die of the plurality of LED dies, the intermediate sheet being applied over the top surface of the first substrate, the intermediate sheet comprising
holes corresponding to locations of the LED dies on the first substrate, and
a plurality of prisms on a bottom surface of the intermediate sheet, the prisms being substantially coplanar with the plurality of LED dies and arranged between adjacent LED dies of the plurality of LED dies, and configured to redirect at least some light emitted through side walls of the LED dies,
wherein each LED die is encapsulated in a corresponding one of the holes in an encapsulant;
a transparent second substrate applied over the intermediate sheet; and
a plurality of tiles formed on the second substrate at locations corresponding to the location of the plurality of LED dies,
wherein at least one of the encapsulant and the plurality of tiles include a wavelength conversion material for generating white light.

8. The lighting device of claim 7, wherein
the flexible sheet corresponds to a 2 foot×4 foot ceiling luminaire, and
the plurality of LED dies are affixed on the top surface of the first substrate in a pseudo-random pattern, such that inoperability of any one of the plurality of LED dies does not substantially modify an illumination pattern emitted by the ceiling luminaire.

9. The lighting device of claim 7, wherein
the flexible sheet forms a strip, the strip having a longitudinal dimension longer than a transverse dimension, configured to provide light substantially the same to that produced by a T8 fluorescent lamp in a ceiling luminaire, and
the plurality of LED dies are affixed on the top surface of the first substrate in a pseudo-random pattern, such that inoperability of any one of the plurality of LED dies does not substantially modify an illumination pattern emitted by the strips.

10. The lighting device of claim 7, wherein at least some of the conductors are arranged to electrically interconnect some of the plurality of LED dies in series.

11. The lighting device of claim 7, wherein each LED die of the plurality of LED dies has a reflector formed over a top surface of the LED die such that the LED dies only emit light through side walls of the LED dies.

12. The lighting device of claim 7, further comprising a reflector layer coupled to the first substrate.

\* \* \* \* \*